(12) United States Patent
Chiu et al.

(10) Patent No.: US 11,996,324 B2
(45) Date of Patent: May 28, 2024

(54) CONDUCTIVE FEATURE OF A SEMICONDUCTOR DEVICE AND METHOD OF FORMING SAME

(71) Applicant: Taiwan Semiconductor Manufacturing Co., Ltd., Hsinchu (TW)

(72) Inventors: U-Ting Chiu, Hsinchu (TW); Po-Nan Yeh, Hsinchu (TW); Yu-Shih Wang, Tainan (TW); Chun-Neng Lin, Hsinchu County (TW); Ming-Hsi Yeh, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 17/193,201

(22) Filed: Mar. 5, 2021

(65) Prior Publication Data
US 2022/0285209 A1    Sep. 8, 2022

(51) Int. Cl.
*H01L 21/768* (2006.01)
*H01L 23/522* (2006.01)
*H01L 23/532* (2006.01)
*H01L 23/535* (2006.01)

(52) U.S. Cl.
CPC .. *H01L 21/76831* (2013.01); *H01L 21/76805* (2013.01); *H01L 21/76846* (2013.01); *H01L 21/76849* (2013.01); *H01L 21/76877* (2013.01); *H01L 21/76895* (2013.01); *H01L 23/5226* (2013.01); *H01L 23/53257* (2013.01); *H01L 23/535* (2013.01)

(58) Field of Classification Search
CPC ......... H01L 21/76831; H01L 21/76877; H01L 21/76879
See application file for complete search history.

(56) References Cited

U.S. PATENT DOCUMENTS

| | | |
|---|---|---|
| 9,105,490 B2 | 8/2015 | Wang et al. |
| 9,236,267 B2 | 1/2016 | De et al. |
| 9,236,300 B2 | 1/2016 | Liaw |
| 9,406,804 B2 | 8/2016 | Huang et al. |
| 9,443,769 B2 | 9/2016 | Wang et al. |
| 9,520,482 B1 | 12/2016 | Chang et al. |
| 9,548,366 B1 | 1/2017 | Ho et al. |
| 9,576,814 B2 | 2/2017 | Wu et al. |
| 9,831,183 B2 | 11/2017 | Lin et al. |
| 9,859,386 B2 | 1/2018 | Ho et al. |
| 2018/0350723 A1* | 12/2018 | Huang .............. H01L 21/76834 |
| 2019/0164817 A1* | 5/2019 | Khaderbad ....... H01L 29/66545 |
| 2020/0043777 A1* | 2/2020 | Kung .................. H01L 21/7684 |

\* cited by examiner

*Primary Examiner* — Thanhha S Pham
(74) *Attorney, Agent, or Firm* — Slater Matsil, LLP

(57) ABSTRACT

A method of forming a semiconductor device includes: forming a semiconductor feature over a substrate, the semiconductor feature includes a conductive region; forming a dielectric layer over the semiconductor feature; patterning the dielectric layer to form a contact opening exposing a top surface of the conductive region; forming a monolayer over the dielectric layer, the top surface of the conductive region remaining exposed; and depositing a conductive material in the contact opening.

20 Claims, 17 Drawing Sheets

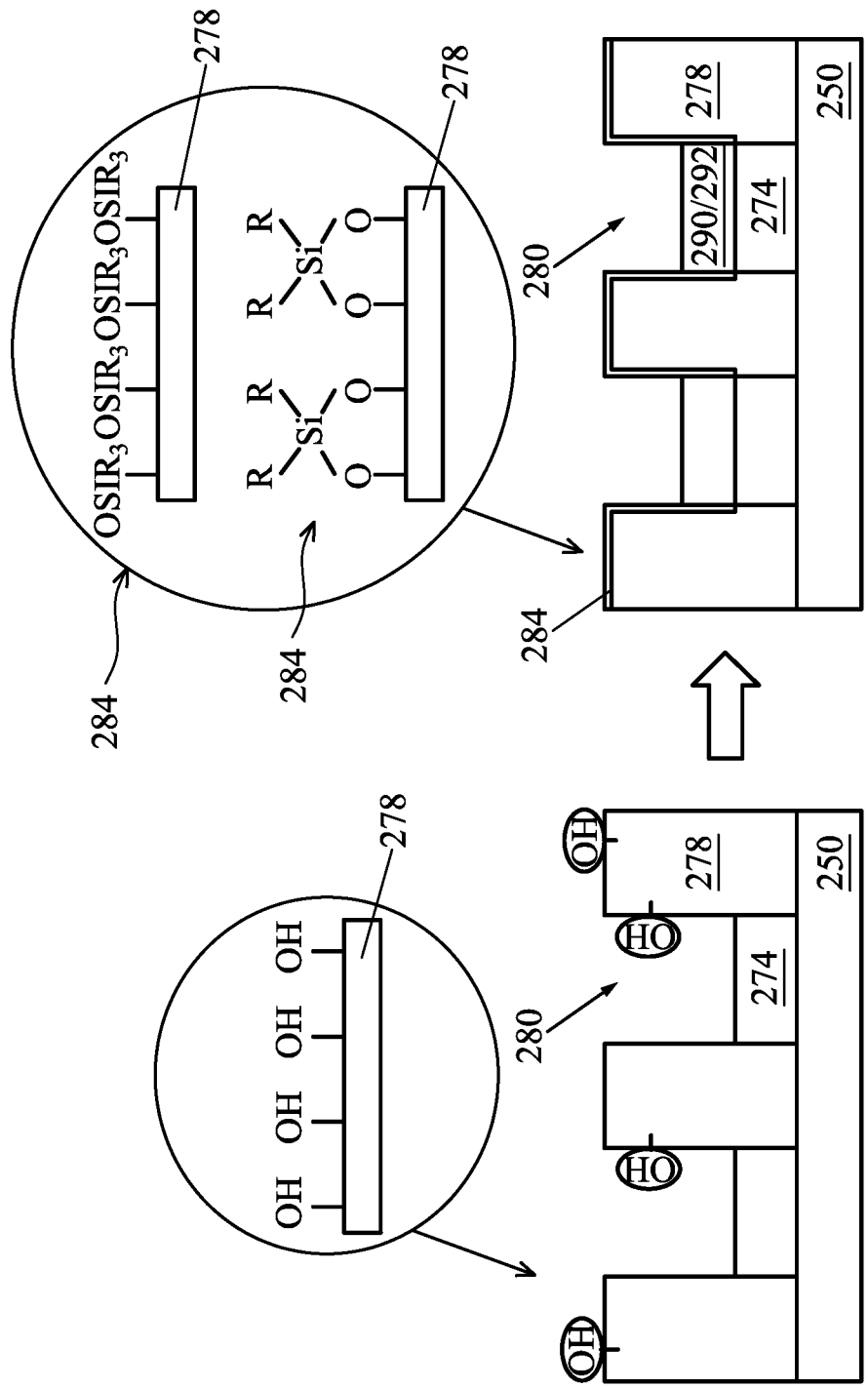

CONDUCTIVE FEATURE OF A SEMICONDUCTOR DEVICE AND METHOD OF FORMING SAME

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (e.g., the number of interconnected devices per chip area) has generally increased while geometry size (e.g., the smallest component (or line) that can be created using a fabrication process) has decreased. This scaling down process generally provides benefits by increasing production efficiency and lowering associated costs.

Accompanying the scaling down of devices, manufacturers have begun using new and different materials and/or combination of materials to facilitate the scaling down of devices. Scaling down, alone and in combination with new and different materials, has also led to challenges that may not have been presented by previous generations at larger geometries.

BRIEF DESCRIPTION OF THE DRAWINGS

Aspects of the present disclosure are understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 17 and 18 illustrate cross-sectional views of intermediate stages in the formation of semiconductor devices, in accordance with some embodiments.

DETAILED DESCRIPTION

Figure 1:
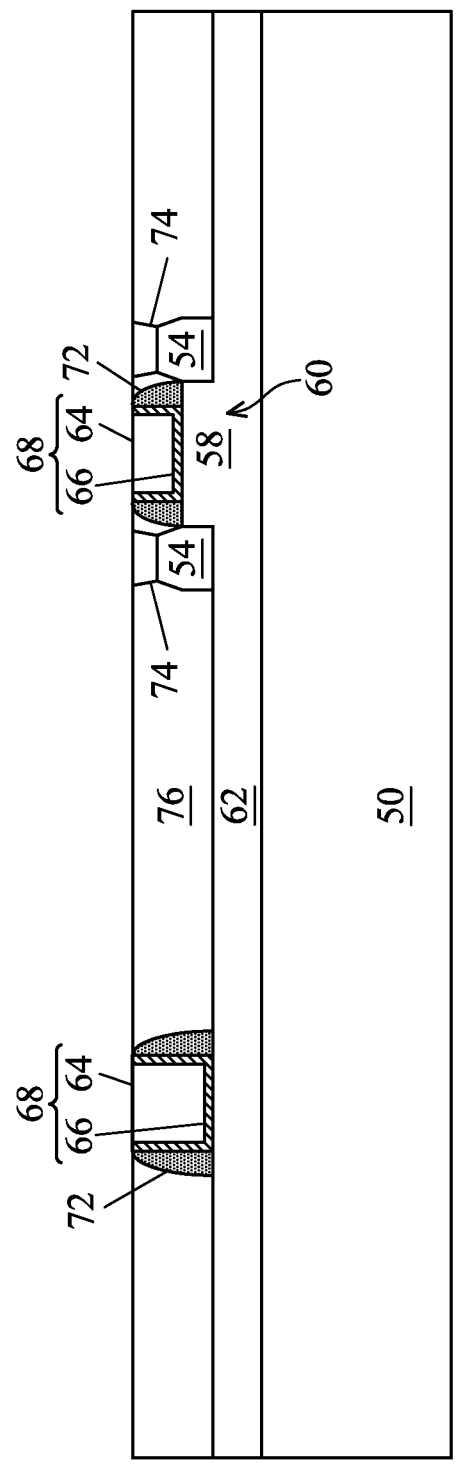
FIGS. 1, 2, 3, 4, 5, 6, 7, 8, 9, 10, 11, 12, 13, 14, 15, and 16 illustrate cross-sectional views of intermediate stages in the formation of interconnect structures of integrated circuits, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Where applicable, the term "substantially" may also include embodiments with "entirely", "completely", "all", etc. Where applicable, the term "substantially" may also relate to 90% or higher, such as 95% or higher, especially 99% or higher, including 100%.

In accordance with some embodiments, conductive features, such as contact plugs over gate electrodes and source/drain regions, are formed with several benefits. For example, certain conductive features may be formed without a conductive barrier layer. After an opening for the conductive feature is formed in a dielectric layer, the dielectric layer may be treated to increase the selectivity of the conductive material of the conductive feature to be deposited in the opening versus deposited onto the dielectric layer.

Performance of an integrated circuit, including a conductive feature within the integrated circuit, may be improved in several ways. First, the conductivity of the conductive feature may be improved by forming it with substantially a conductive material—that is, without the need of combining the conductive material with a conductive barrier layer. Second, the conductivity of the conductive feature may be improved by being free of grain boundaries that may otherwise develop between the conductive material and a conductive barrier layer. Third, the performance of the integrated circuit may improve due to a lower incidence of metals (e.g., from a barrier layer or the conductive material) being deposited over the dielectric layer and, consequently, intermixing or diffusing into the dielectric layer.

In addition, the semiconductor manufacturing process may be more efficient and with a reduced cost by replacing formation of a barrier layer with a chemical treatment of the dielectric layer before forming the conductive feature. For example, in some cases, forming a barrier layer may utilize multiple deposition cycles of alternating precursors to form a complete monolayer of the conductive barrier layer, such that a complete monolayer includes full coverage of an underlying surface. In accordance with some embodiments, the treatment disclosed herein may be a fast process, and may be performed at low temperatures (thereby reducing the thermal budget), as described in the following embodiments, than formation of a conductive barrier layer. In some embodiments, a single cycle with each precursor may achieve the proposed surface property.

Further, the conductive features may be formed at a high aspect ratio, which is described in the following embodiments, because the added material within the dielectric opening from treating the dielectric layer is small in comparison to the thickness of a conductive barrier layer deposited in the dielectric opening. As such, the conductive material has an increased amount of room to deposit more efficiently and with less build up in upper portions of the opening, which therefore allows the conductive material to be deposited in openings that are narrower and deeper.

FIGS. 1 through 16 illustrate cross-sectional views of intermediate stages in the formation of conductive features and interconnect structures of integrated circuits, in accordance with some embodiments. FIGS. 1 through 6 and 14-16 illustrate formation of contact plugs of an interconnect structure using a single damascene process. FIGS. 7 through 13 illustrate formation of conductive lines and a metallization layer (including metallization lines and metallization vias) of additional portions of the interconnect structure using a single or dual damascene process.

FIG. 1 illustrates a cross-sectional view of a semiconductor structure on a wafer 100 comprising a substrate 50 (e.g., a semiconductor substrate) in which various electronic devices may be formed over the substrate 50, in accordance with some embodiments. In subsequent figures, a multilevel interconnect system may be formed over the various electronic devices and the substrate 50. As will be discussed in greater detail below, FIG. 1 illustrates a Fin field effect transistor (FinFET) device 60 formed on the substrate 50, with multiple interconnection layers formed thereover in later figures. Planar transistors, gate-all-around (GAA) transistors, and other types of devices are within the contemplated scope of this disclosure.

The substrate 50 illustrated in FIG. 1 may comprise a bulk semiconductor substrate or a silicon-on-insulator (SOI) substrate. An SOI substrate includes an insulator layer below a thin semiconductor layer that is the active layer of the SOI substrate. The semiconductor of the active layer and the bulk semiconductor generally comprise the crystalline semiconductor material silicon, but may include one or more other semiconductor materials such as germanium, silicon-germanium alloys, compound semiconductors (e.g., GaAs, AlAs, InAs, GaN, MN, and the like), or their alloys (e.g., $Ga_xAl_{1-x}As$, $Ga_xAl_{1-x}N$, $In_xGa_{1-x}As$ and the like), oxide semiconductors (e.g., ZnO, $SnO_2$, $TiO_2$, $Ga_2O_3$, and the like) or combinations thereof. The semiconductor materials may be doped or undoped. Other substrates that may be used include multi-layered substrates, gradient substrates, or hybrid orientation substrates.

The FinFET device 60 illustrated in FIG. 1 is a three-dimensional metal-oxide-semiconductor field effect transistor (MOSFET) structure formed in fin-like strips of semiconductor protrusions referred to as fins 58. The cross-section shown in FIG. 1 is taken along a longitudinal axis of the fin in a direction parallel to the direction of the current flow between the source and drain regions 54. The fin 58 may be formed by patterning the substrate using photolithography and etching techniques. For example, a spacer image transfer (SIT) patterning technique may be used. In this method a sacrificial layer is formed over a substrate and patterned to form mandrels using suitable photolithography and etch processes. Spacers are formed alongside the mandrels using a self-aligned process. The sacrificial layer is then removed by an appropriate selective etch process. Each remaining spacer may then be used as a hard mask to pattern the respective fin 58 by etching a trench into the substrate 5o using, for example, reactive ion etching (RIE). FIG. 1 illustrates a single fin 58, although the substrate 50 may comprise any number of fins.

Shallow trench isolation (STI) regions 62 formed along opposing sidewalls of the fin 58 are illustrated in FIG. 1. STI regions 62 may be formed by depositing one or more dielectric materials (e.g., silicon oxide) to completely fill the trenches around the fins and then recessing the top surface of the dielectric materials. The dielectric materials of the STI regions 62 may be deposited using a high density plasma chemical vapor deposition (HDP-CVD), a low-pressure CVD (LPCVD), sub-atmospheric CVD (SACVD), a flowable CVD (FCVD), spin-on, and/or the like, or a combination thereof. After the deposition, an anneal process or a curing process may be performed. In some cases, the STI regions 62 may include a liner such as, for example, a thermal oxide liner grown by oxidizing the silicon surface. The recess process may use, for example, a planarization process (e.g., a chemical mechanical polish (CMP)) followed by a selective etch process (e.g., a wet etch, or dry etch, or a combination thereof) that may recess the top surface of the dielectric materials in the STI region 62 such that an upper portion of the fins 58 protrudes from surrounding insulating STI regions 62. In some cases, the patterned hard mask used to form the fins 58 may also be removed by the planarization process.

In some embodiments, the gate structure 68 of the FinFET device 60 illustrated in FIG. 1 is a high-k, metal gate (HKMG) gate structure that may be formed using a gate-last process flow. In a gate last process flow a sacrificial dummy gate structure (not shown) is formed after forming the STI regions 62. The dummy gate structure may comprise a dummy gate dielectric, a dummy gate electrode, and a hard mask. First, a dummy gate dielectric material (e.g., silicon oxide, silicon nitride, silicon oxynitride, or the like) may be deposited. Next, a dummy gate material (e.g., amorphous silicon, polycrystalline silicon, or the like) may be deposited over the dummy gate dielectric and then planarized (e.g., by CMP). A hard mask layer (e.g., silicon nitride, silicon carbide, or the like) may be formed over the dummy gate material. The dummy gate structure is then formed by patterning the hard mask and transferring that pattern to the dummy gate dielectric and dummy gate material using suitable photolithography and etching techniques. The dummy gate structure may extend along multiple sides of the protruding fins 58 and extend between the fins 58 over the surface of the STI regions 62. As described in greater detail below, the dummy gate structure may be replaced by the gate structure 68 as illustrated in FIG. 1. The gate structure 68 illustrated in the right side in FIG. 1 (seen on the top of fin 58) is an example of an active gate structure which extends, e.g., along sidewalls of and over the portion of fin 58 protruding above the STI region 62. The gate structure 68 in the left side in FIG. 1 is an example gate structure extending over the STI region 62, such as between adjacent fins 58. The materials used to form the dummy gate structure and hard mask may be deposited using any suitable method such as CVD, plasma-enhanced CVD (PECVD), atomic layer deposition (ALD), plasma-enhanced ALD (PEALD) or the like, or by thermal oxidation of the semiconductor surface, or combinations thereof.

Source and drain regions 54 and spacers 72 of FinFET 60, illustrated in FIG. 1, are formed, for example, self-aligned to the dummy gate structures. Spacers 72 may be formed by deposition and anisotropic etch of a spacer dielectric layer performed after the dummy gate patterning is complete. The spacer dielectric layer may include one or more dielectrics, such as silicon oxide, silicon nitride, silicon oxynitride, silicon carbide, silicon carbonitride, the like, or a combination thereof. The anisotropic etch process removes the spacer dielectric layer from over the top of the dummy gate structures leaving the spacers 72 along the sidewalls of the dummy gate structures extending laterally onto a portion of the surface of the fin 58 (as illustrated in the right side of FIG. 1) or the surface of the STI region 62 (as illustrated in the left side of FIG. 1).

Source and drain regions 54 are semiconductor regions in contact with the fin 58. In some embodiments, the source and drain regions 54 may comprise heavily-doped regions and relatively lightly-doped drain (LDD) extensions. The heavily-doped regions are spaced away from the dummy gate structures using the spacers 72. The LDD regions may be formed prior to forming spacers 72 and, hence, extend under the spacers 72 and, in some embodiments, extend further into a portion of the semiconductor below the dummy gate structure. The LDD regions may be formed, for example, by implanting dopants (e.g., As, P, B, In, or the like) using an ion implantation process.

The source and drain regions 54 may comprise an epitaxially grown region. For example, after forming the LDD regions, the spacers 72 may be formed and, subsequently, the heavily-doped source and drain regions may be formed self-aligned to the spacers 72. In particular, the heavily-doped source and drain regions may be formed by first etching the fins to form recesses, and then depositing a crystalline semiconductor material in the recess by a selective epitaxial growth (SEG) process that may fill the recess and, typically, extend beyond and above the original surface of the fin to form a raised source-drain structure, as illustrated in FIG. 1. The crystalline semiconductor material may be elemental (e.g., Si, or Ge, or the like), or an alloy (e.g., $Si_{1-x}C_x$, or $Si_{1-x}Ge_x$, $Si_{1-x-y}Ge_xC_y$, or the like). The SEG process may use any suitable epitaxial growth method, such as e.g., vapor/solid/liquid phase epitaxy (VPE, SPE, LPE), or metal-organic CVD (MOCVD), or molecular beam epitaxy (MBE), or the like. A high dose (e.g., from about $10^{14}$ $cm^{-2}$ to $10^{16}$ $cm^{-2}$) of dopants may be introduced into the heavily-doped source and drain regions 54 either in situ during SEG, or by an ion implantation process performed after the SEG, or by a combination thereof. The source and drain regions 54 may be formed by other processes, such as ion implantation of dopants, and the like.

Still referring to FIG. 1, a first interlayer dielectric (ILD) layer 76 is deposited over the structure. In some embodiments, a contact etch stop layer (CESL) (not specifically illustrated) of a suitable dielectric (e.g., silicon nitride, silicon carbide, or the like, or a combination thereof) may be deposited prior to depositing the ILD material. A planarization process (e.g., CMP) may be performed to remove excess ILD material and any remaining hard mask material from over the dummy gates to form a top surface wherein the top surface of the dummy gate material is exposed and may be substantially coplanar with the top surface of the first ILD layer 76.

The HKMG gate structures 68, illustrated in FIG. 1, may then be formed by first removing the dummy gate structures using one or more etching techniques, thereby creating recesses between respective spacers 72. Next, a replacement gate dielectric layer 66 comprising one or more dielectrics, followed by a replacement conductive gate layer 64 comprising one or more conductive materials, may be deposited to completely fill the recesses. The gate dielectric layer 66 includes, for example, a high-k dielectric material such as oxides and/or silicates of metals (e.g., oxides and/or silicates of Hf, Al, Zr, La, Mg, Ba, Ti, and other metals), silicon nitride, silicon oxide, and the like, combinations thereof, or multilayers thereof. In some embodiments, the conductive gate layer 64 may be a multilayered metal gate stack comprising a barrier layer, a work function layer, and a gate-fill layer formed successively on top of gate dielectric layer 66. Example materials for a barrier layer include TiN, TaN, Ti, Ta, or the like, or a multilayered combination thereof. A work function layer may include TiN, TaN, Ru, Mo, Al, for a p-type FET, and Ti, Ag, TaAl, TaAlC, TiAlN, TaC, TaCN, TaSiN, Mn, Zr, for an n-type FET. Other suitable work function materials, or combinations, or multilayers thereof may be used. The gate-fill layer which fills the remainder of the recess may comprise metals such as Cu, Al, W, Co, Ru, or the like, or combinations thereof, or multi-layers thereof. The materials used in forming the gate structure may be deposited by any suitable method, e.g., CVD, PECVD, physical vapor deposition (PVD), ALD, PEALD, electrochemical plating (ECP), electroless plating and/or the like. Excess portions of the gate structure layers 64 and 66 may be removed from over the top surface of first ILD layer 76 using, for example a CMP process. The resulting structure, as illustrated in FIG. 1, may be a substantially coplanar surface comprising an exposed top surface of the first ILD layer 76, the spacers 72, and remaining portions of the HKMG gate layers (i.e., the gate structure layers 64 and 66) inlaid between respective spacers 72.

As illustrated in FIG. 1, electrodes of electronic devices formed in the substrate 50 may be electrically connected to conductive features of a first interconnect level (formed subsequently in later figures) using conductive connectors (e.g., lower contact plugs 74) formed through the intervening dielectric layers. In the example illustrated in FIG. 1, the lower contact plugs 74 make electrical connections to the source and drain regions 54 of FinFET 60. The lower contact plugs 74 may be formed using photolithography techniques. For example, a patterned mask may be formed over the first ILD layer 76 and used to etch openings that extend through the first ILD layer 76 to expose portions of the source and drain regions 54. In some embodiments, an anisotropic dry etch process may be used wherein the etching is performed in two successive steps. The etchants used in the first step of the etch process have a higher etch rate for the materials of the first ILD layer 76 relative to the etch rate for the materials used in the CESL, which may be lining the top surface of the heavily-doped regions of the source and drain regions 54. Once the first step of the etch process exposes the CESL, the second step of the etch process may be performed wherein the etchants may be switched to selectively remove the CESL. While the first ILD layer 76 is illustrated, embodiments having two or more ILD layers are within the contemplated scope of this disclosure.

In some embodiments, a conductive liner may be formed in the openings in the first ILD layer 76. Subsequently, the openings are filled with a conductive fill material. The liner comprises barrier metals used to reduce out-diffusion of conductive materials from the lower contact plugs 74 into the surrounding dielectric materials. In some embodiments, the liner may comprise two barrier metal layers. The first barrier metal comes in contact with the semiconductor material in the source and drain regions 54 and may be subsequently chemically reacted with the heavily-doped semiconductor in the source and drain regions 54 to form a low resistance ohmic contact, after which the unreacted metal may be removed. For example, if the heavily-doped semiconductor in the source and drain regions 54 is silicon or silicon-germanium alloy semiconductor, then the first barrier metal may comprise Ti, Ni, Pt, Co, other suitable metals, or their alloys. The second barrier metal layer of the conductive liner may additionally include other metals (e.g., TiN, TaN, Ta, or other suitable metals, or their alloys). A conductive fill material (e.g., W, Al, Cu, Ru, Ni, Co, alloys of these, the like, or any combination thereof) may be deposited over the conductive liner layer to fill the contact openings, using any acceptable deposition technique (e.g., CVD, ALD, PEALD, PECVD, PVD, ECP, electroless plating, the like, or any combination thereof). Next, a planarization process (e.g., CMP) may be used to remove excess portions of all the conductive materials from over the surface of the first ILD layer 76. The resulting conductive plugs extend into the first ILD layer 76 and constitute lower contact plugs 74 making physical and electrical connections to the electrodes of electronic devices, such as a tri-gate FinFET, as illustrated in FIG. 1. In this example, contacts to electrodes over STI region 62 and to electrodes over fins 58 are formed simultaneously using the same processing steps. However, in other embodiments these two types of contacts may be formed separately.

Figure 2:
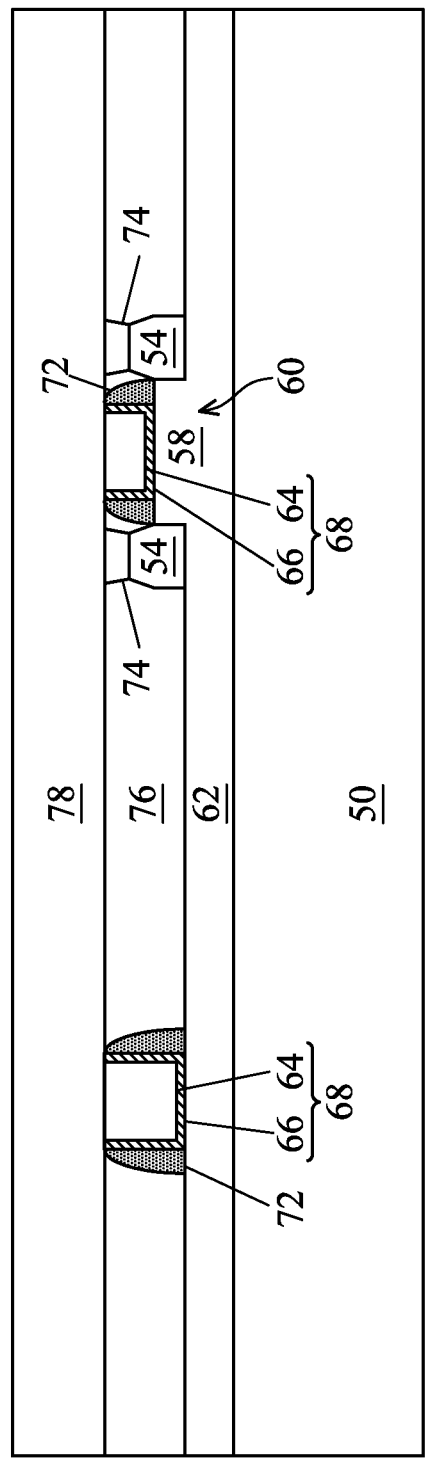

In FIG. 2, a second ILD layer 78 may be deposited over the first ILD layer 76, as illustrated in FIG. 1. In some embodiments, another CESL (not specifically illustrated) of a suitable dielectric (e.g., silicon nitride, silicon carbide, or the like, or a combination thereof) may be deposited prior to depositing the ILD material. A planarization process (e.g., CMP) may be performed to remove excess ILD material to form a smooth top surface. In some embodiments, the insulating materials that form the first ILD layer 76 and the second ILD layer 78 may comprise silicon oxide, phosphosilicate glass (PSG), borosilicate glass (BSG), boron-doped phosphosilicate glass (BPSG), undoped silicate glass (USG), a low dielectric constant (low-k) dielectric such as, fluorosilicate glass (FSG), silicon oxycarbide (SiOCH), carbon-doped oxide (CDO), flowable oxide, or porous oxides (e.g., xerogels/aerogels), or the like, or a combination thereof. The insulating materials used to form the first ILD layer 76 and the second ILD layer 78 may be deposited using any suitable method, such as CVD, PVD, ALD, PEALD, PECVD, SACVD, FCVD, spin-on, and/or the like, or a combination thereof. In some embodiments, one or more etch stop layers (not specifically illustrated) are also formed over the structure above and/or below the illustrated ILD layers.

Figure 3:
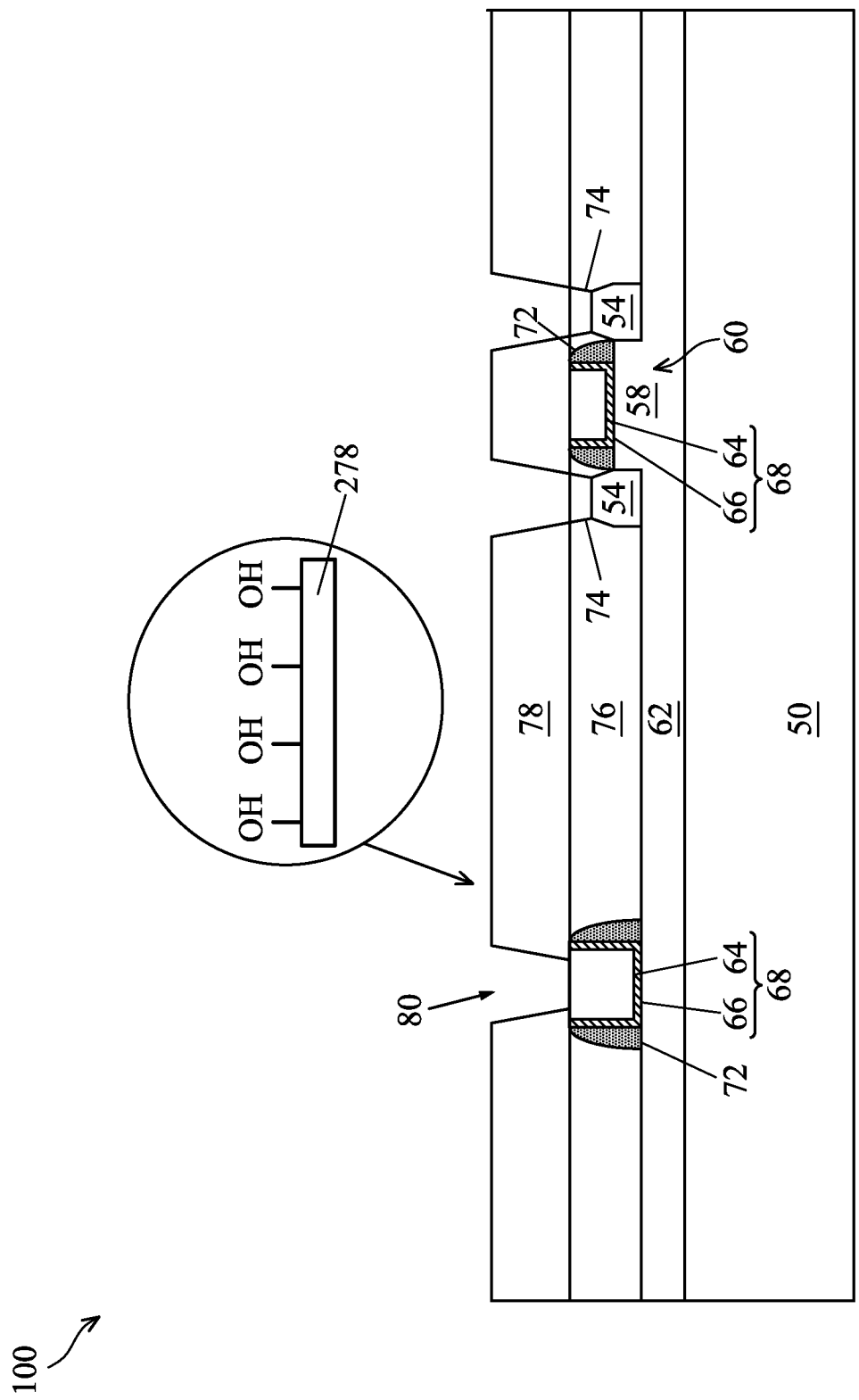

In FIG. 3, openings 80 are formed in the second ILD layer 78. Formation of the openings 80 may include performing a photolithography process to etch a mask layer (not specifically illustrated) in order to form initial openings. The photolithography process may include forming a photoresist (also not specifically illustrated) over the mask layer, patterning the photoresist with openings corresponding to the openings 80, extending the openings 80 through the mask layer, and then removing the photoresist. The openings 80 are extended through the second ILD layer 78 by using acceptable etching techniques. In an embodiment, the openings 80 are formed by an anisotropic dry etch process. For example, the etching process may include a dry etch process using a reaction gas that selectively etches the second ILD layer 78 without significantly etching the mask layer. The etching process is performed until the openings 80 expose the CESL (not specifically illustrated). For example, the etching process may include the formation of a reactive species from an etchant gas using a plasma. In some embodiments, the plasma may be a remote plasma. The etchant gas may include a fluorocarbon chemistry such as $C_4F_6/CF_4/C_5F$ and $NF_3/O_2/N_2/Ar/H_3/H_2$, the like, or a combination thereof. In some embodiments, the etchant uses fluorocarbon chemistry with $O_2$ or Ar as the carrier gas. Portions of the CESL in the openings 80 are removed to expose the underlying lower contact plugs 74. The CESL may be removed using an anisotropic wet or dry etch that is selective to the material of the CESL. For example, the CESL may be remove using an anisotropic wet etch that uses etchant reactants such as $H_2O_2$. The etching process used to remove the CESL may be different from the etching processes used to form the openings 80 (e.g., different etchants and/or other etching process parameters may be used).

As illustrated in the zoomed in portion of FIG. 3, in some embodiments, after forming and patterning the second ILD layer 78, the second ILD layer 78 may have a concentration of hydroxyl groups (—OH groups) extending from the exposed surface. The concentration of exposed hydroxyl groups may be between about $1 \times 10^{14}$ hydroxyl groups/cm$^2$ to about $7 \times 10^{14}$ hydroxyl groups/cm$^2$, such as about $4 \times 10^{14}$ hydroxyl groups/cm$^2$. In certain embodiments, after patterning the second ILD layer 78, a cleaning process is performed, which increases the density of hydroxyl groups extending from the exposed surface. The cleaning process may comprise washing the wafer with materials such as hydrogen peroxide ($H_2O_2$), ammonium hydroxide ($NH_4OH$), ammonium peroxide (($NH_4$)$_2O_2$), water, dilute hydrogen fluoride (dHF), the like, and/or combinations thereof, such as a Standard Clean 1 (SC1) comprising ammonium hydroxide, hydrogen peroxide, and water (APM solution). After the cleaning process, the concentration of exposed hydroxyl groups may be between about $1 \times 10^{15}$ hydroxyl groups/cm$^2$ to about $7 \times 10^{15}$ hydroxyl groups/cm$^2$, such as about $4 \times 10^{15}$ hydroxyl groups/cm$^2$.

Figure 4:
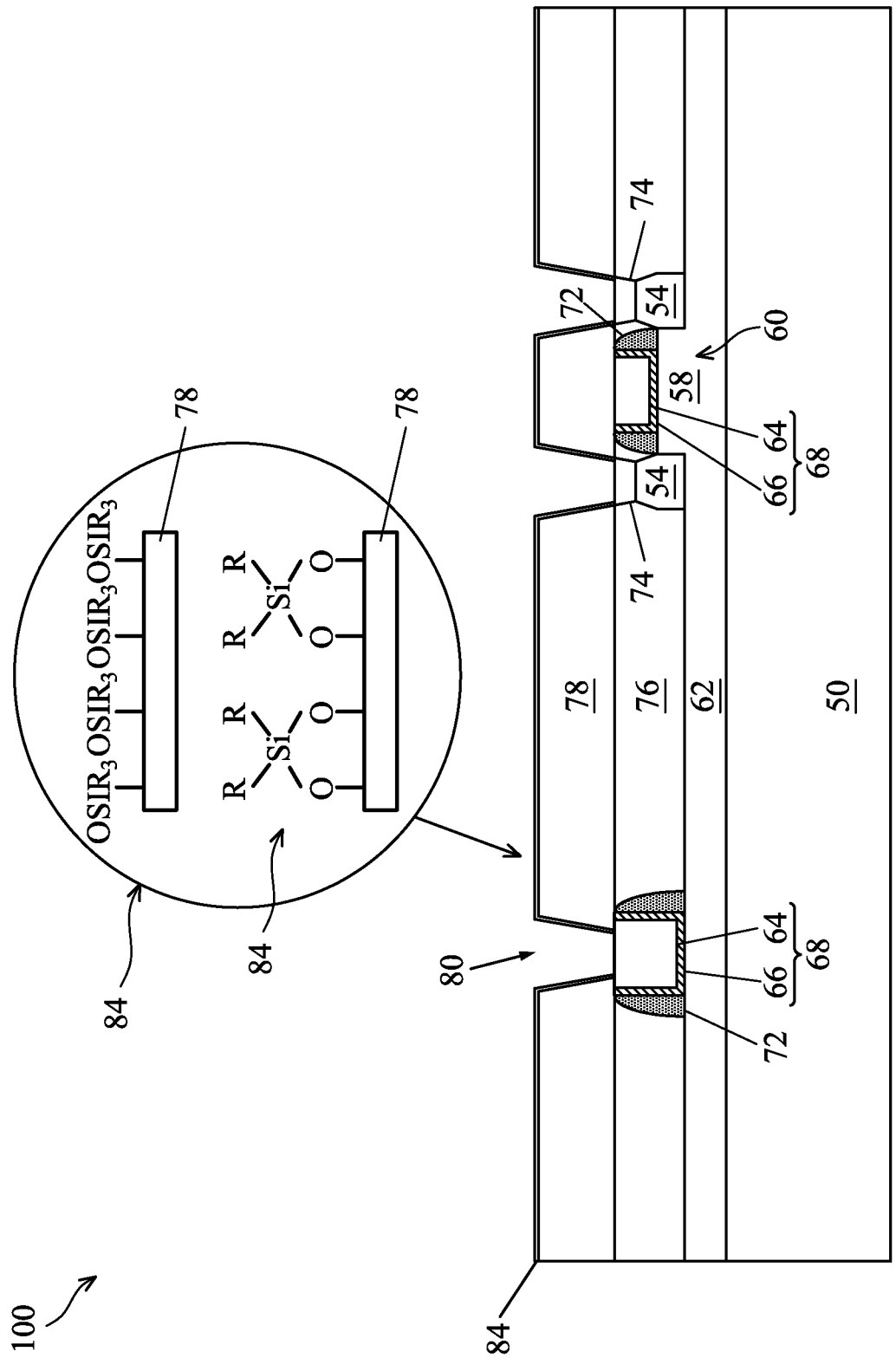

In FIG. 4, a self-aligned monolayer (SAM) 84 is formed over the second ILD layer 78. As discussed later, the self-aligned monolayer 84 protects the second ILD layer 78 (or portions of the second ILD layer 78) from metal growth in a subsequent step by increasing the selectivity between growth of that metal on a metal surface versus the surface of the second ILD layer 78 and/or the self-aligned monolayer 84. The self-aligned monolayer 84 may be formed by reacting a monolayer precursor with the hydroxyl groups extending from the surface of the second ILD layer 78. In some embodiments, the product of the reaction may include attached portions that replace a hydrogen atom from such a hydroxyl group or replace the hydroxyl group in its entirety. The hydrogen atom or hydroxyl group would then be purged from the environment. As a result of the reaction, the product may form a monolayer along the surface of the second ILD layer 78. In collectively forming the self-aligning monolayer 84, the attached portions may laterally bond with one another or comprise discrete portions. In the case of the latter, the discrete portions may have chemical attractions toward one another. As such, the term "monolayer" is meant to include cases in which the attached groups coat the surface of the second ILD layer 78 even if the newly attached groups do not bond with one another to form a continuous chemical structure.

In some embodiments, the self-aligned monolayer 84 is formed by flowing a silicon-containing monolayer precursor over the surface of the second ILD layer 78. As illustrated in the zoomed in portion of FIG. 4, the monolayer precursor and the exposed hydroxyl groups on the surface of the second ILD layer 78 undergo an exchange reaction which results in silylation of the surface of the second ILD layer 78. The silicon of the monolayer precursor attaches to the second ILD layer 78. The monolayer precursor may have the following chemical structure:

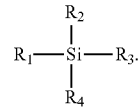

wherein $R_1$ is a functional group comprising hydroxide (—OH), and each of $R_2$, $R_3$, and $R_4$ is a functional group, such as a hydrophobic functional group, comprising methyl (—CH$_3$), ethyl (—CH$_2$CH$_3$), nitrogen, azanide (—NH$_2$), benzene, imidazole, or the like. $R_2$, $R_3$, and/or $R_4$ may comprise the same or different functional groups as one another. During the silylation reaction, the $R_1$ functional group will combine with hydrogen from a hydroxyl group attached to the second ILD layer 78. The resulting $R_1$—H product will have a gaseous state and be unattached from the second ILD layer 78 to be later removed from the system. The silicon in the remainder of the precursor will bond with oxygen from the hydroxyl group.

In some embodiments, the self-aligned monolayer 84 is formed by flowing a non-reactive (or substantially non-reactive) monolayer precursor over the surface of the second ILD layer 78. The monolayer precursor may comprise, for example, an organic molecule which does not undergo any significant reaction with the second ILD layer 78, including the exposed hydroxyl groups along the surface of the second ILD layer 78. Instead, the organic molecule may selectively deposit over the second ILD layer 78 and not form over the exposed lower contact plugs 74 or the gate electrodes 64. In some embodiments, the organic molecule forms hydrogen-bonds with the hydroxyl groups. Although the organic molecule may not react, the organic molecule may be attracted to the second ILD layer 78 and, specifically, the hydroxyl groups along the exposed surface of the second ILD layer 78. The organic molecule may comprise a hydrophobic molecule, including a hydrocarbon, such as an alkane (e.g., hexane, heptane, octane, cyclohexane), a benzene ring, or the like, or other molecules or functional groups that do not contain hydroxyl groups or oxygen.

As a result of forming the self-aligned monolayer 84 comprising a hydrophobic molecule or hydrophobic functional groups, the surface of the second ILD layer 78 may be converted from being hydrophilic to hydrophobic. Before forming the self-aligned monolayer 84 and before a cleaning process performed on the second ILD layer 78, the exposed surface of the second ILD layer 78 may be measured to have a contact angle with water of between about 3° and about 5°. Following formation of the self-aligned monolayer 84, the exposed surface of the second ILD layer 78 (including the self-aligned monolayer 84) may be measured to have a greater contact angle with water of between about 10° and about 15°.

Figure 5:
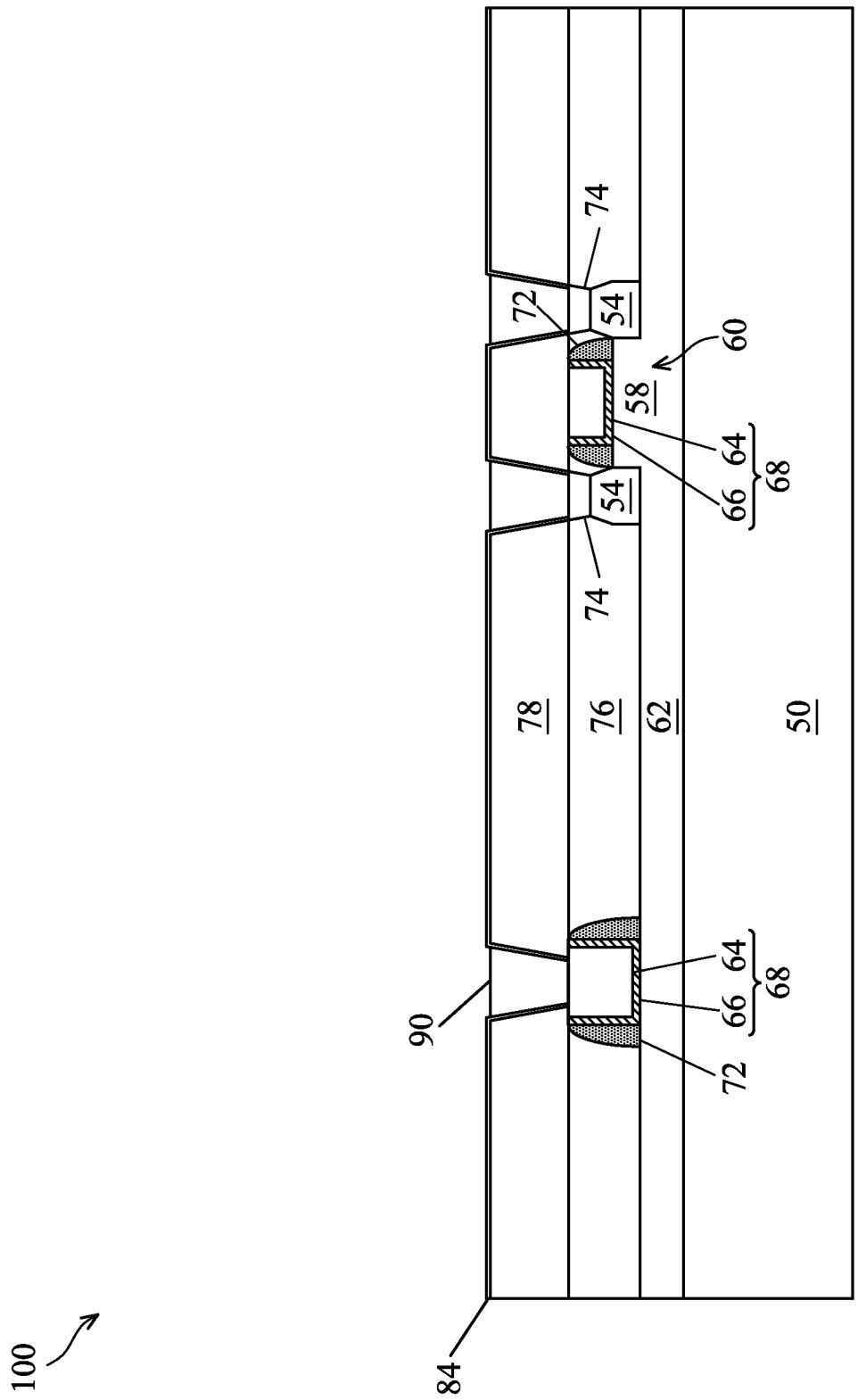

In FIG. 5, a conductive material 90 is filled into the openings 80. The conductive material 90 may be a metallic material including a metal or a metal alloy such as tungsten, cobalt, copper, or alloys thereof. The conductive material 90 may be formed using CVD, ALD, or the like, by flowing a metal precursor over the wafer 100. For example, the metal precursor may comprise a metal-containing molecule, such as tungsten hexafluoride ($WF_6$). Growth of the conductive material 90 may involve, for example, an exchange reaction between the metal precursor and hydrogen in the environment such that fluorine from the metal precursor (e.g., in the case of $WF_6$) will combine with hydrogen to form hydrogen fluoride gas (HF) or with fluorine to form fluorine gas ($F_2$), and tungsten from the metal precursor will attach to the underlying metal (e.g., of the exposed gate electrode 64, the lower contact plug 74, or already-deposited portions of the conductive material 90).

Benefits of the presence of the self-aligned monolayer 84 include obviating the need for a seed layer or a conductive barrier layer (e.g., titanium nitride or tantalum nitride) to be deposited prior to the conductive material 90 growth. Typically, in order to ensure full coverage, a seed layer or conductive barrier layer would require a thickness greater than that of the self-aligned monolayer 84. As such, without a seed layer or a barrier layer, the conductive material 90 has more room to enter and grow in openings 80, thereby allowing for a higher aspect ratio, such as between about 0.4 and about 0.8, such as about 0.6. Additionally, during deposition, the conductive material 90 selectively deposits onto the underlying metals, such as the gate electrode 64 and the lower contact plug 74, instead of the second ILD layer 78 and the self-aligned monolayer 84. Because the nucleation sites are predominantly on the gate electrode 64 and the lower contact plug 74, selectivity loss of nucleation and deposition onto the second ILD layer 78 is prevented or reduced, resulting in improved process efficiency (e.g., a shorter process time) and increased yield.

Figure 6:
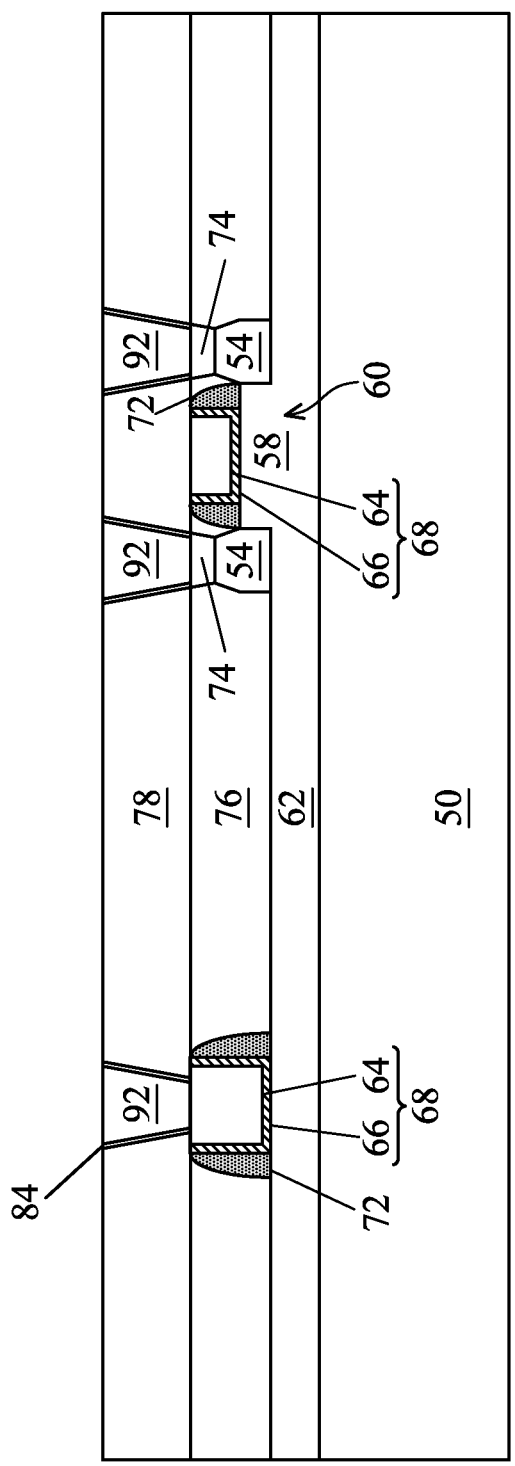

In FIG. 6, upper contact plugs 92 are formed by performing a planarization (e.g., CMP) on the conductive material 90, the self-aligned monolayer 84, and the second ILD layer 78. As a result, top surfaces of the upper contact plugs 92 and the second ILD layer 78 will be level. In addition, the self-aligned monolayer 84 may be removed from the top surfaces of the second ILD layer 78 while still being directly interposed between the second ILD layer 78 and the upper contact plugs 92. As such, without a seed layer or a conductive barrier layer, an entirety of the upper contact plugs 92 comprises the material of the conductive material 90, resulting in improved conductivity during use of the completed semiconductor device.

In some embodiments, particularly when an organic molecule is used to form the self-aligned monolayer 84, a cleaning step may be used to remove the self-aligned monolayer 84 from the top surface of the second ILD layer 78. In those embodiments, the planarization step may follow the cleaning step, or the planarization step may be optional if the conductive material 90, as deposited, is already adequately shaped to form the upper contact plug 92. The cleaning step may include rinsing the wafer 100 with deionized (DI) water, dilute hydrogen fluoride (dHF), the like, or any combinations thereof.

Figure 7:
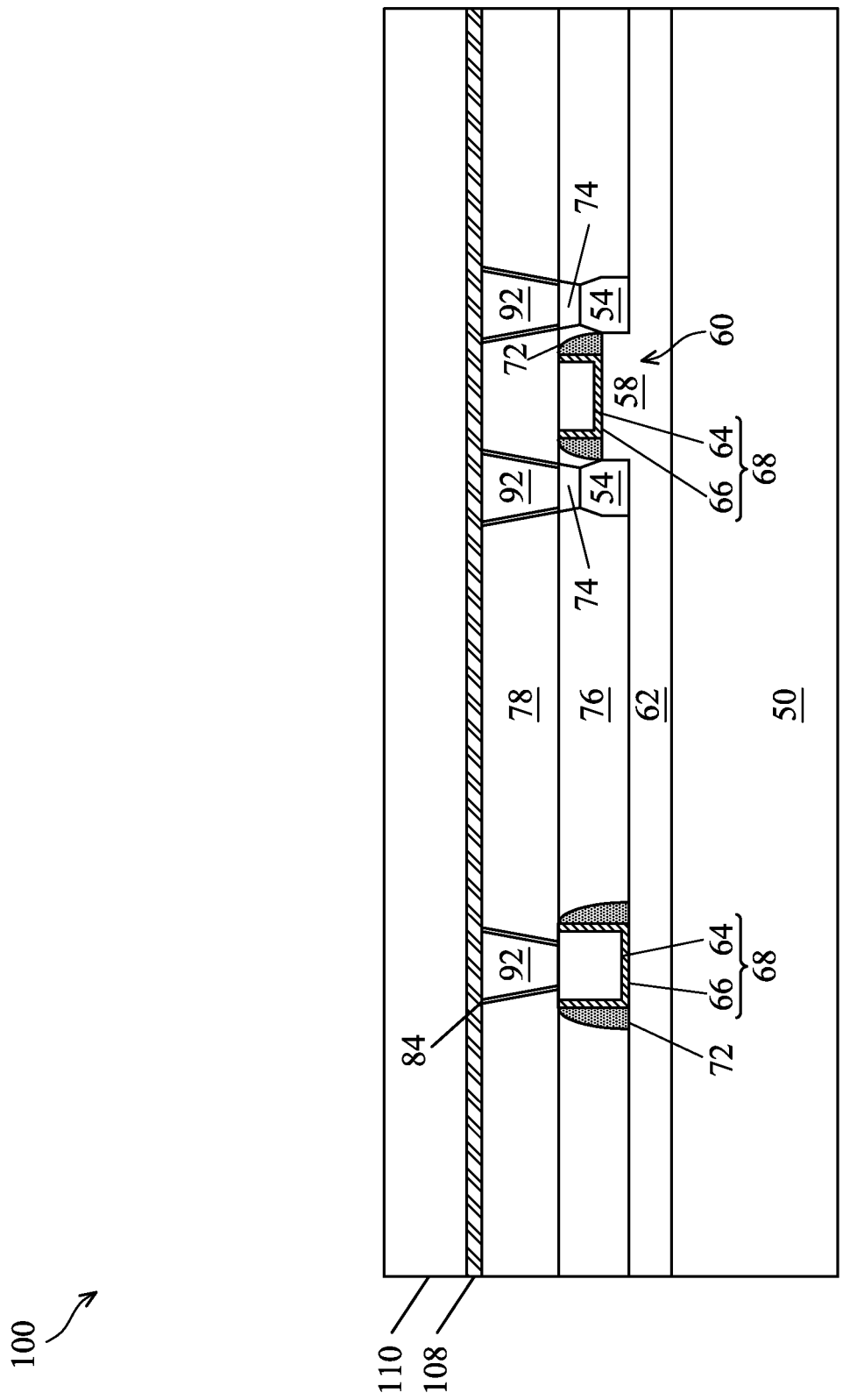

In FIG. 7, an etch stop layer 108 is formed over the second ILD layer 78 and the upper contact plugs 92. The etch stop layer 108 may be formed from silicon carbide, silicon nitride, silicon oxynitride, silicon carbo-nitride, or the like. The etch stop layer 108 may be formed by chemical vapor deposition (CVD), physical vapor deposition (PVD), atomic layer deposition (ALD), a spin-on-dielectric process, the like, or a combination thereof.

Still referring to FIG. 7, an inter-metal dielectric (IMD) layer 110 is formed over the etch stop layer 108. The IMD layer 110 may be a layer formed from a low-k dielectric material having a k-value lower than about 3.0. The IMD layer 110 may be a layer formed from an extra-low-k (ELK) dielectric material having a k-value of less than 2.5. In some embodiments, the IMD layer 110 may be formed from an oxygen-containing and/or carbon containing low-k dielectric material, Hydrogen SilsesQuioxane (HSQ), MethylSilsesQuioxane (MSQ), or the like. The material of the etch stop layer 108 has a high etching selectivity with the IMD layer 110, and hence the etch stop layer 108 may be used to stop the etching of the IMD layer 110 in subsequent processing steps.

In some embodiments, the IMD layer 110 is formed from a porous material such as SiOCN, SiCN, SiOC, SiOCH, or the like and may be formed by initially forming a precursor layer over the etch stop layer 108. The precursor layer may include both a matrix material and a porogen interspersed within the matrix material, or may alternatively include the matrix material without the porogen. In some embodiments the precursor layer may be formed, for example, by co-depositing the matrix and the porogen using a process such as plasma enhanced chemical vapor deposition (PECVD) where the matrix material is deposited at the same time as the porogen, thereby forming the precursor layer with the matrix material and the porogen mixed together. However, as one of ordinary skill in the art will recognize, co-deposition using a simultaneous PECVD process is not the only process that may be used to form the precursor layer. Any suitable process, such as premixing the matrix material and the porogen material as a liquid and then spin-coating the mixture onto the etch stop layer 108, may also be utilized.

The matrix material, or base dielectric material, may be formed using a process such as PECVD, although any suitable process, such as a CVD, PVD, or even spin-on coating, may alternatively be utilized. The PECVD process may utilize precursors such as methyldiethoxysilane (DEMS), although other precursors such as other silanes, alkylsilanes (e.g., trimethylsilane and tetramethylsilane), alkoxysilanes (e.g., methyltriethoxysilane (MTEOS), methyltrimethoxysilane (MTMOS), methyldimethoxysilane (MDMOS), trimethylmethoxysilane (TMMOS) and dimethyldimethoxysilane (DMDMOS)), linear siloxanes and cyclic siloxanes (e.g., octamethylcyclotetrasiloxane (OMCTS) and tetramethylcyclotetrasiloxane (TMCTS)), combinations of these, or the like may alternatively be utilized. However, as one of ordinary skill in the art will recognize, the materials and processes listed herein are merely illustrative and are not meant to be limiting to the embodiments, as any other suitable matrix precursors may alternatively be utilized.

The porogen may be a molecule that can be removed from the matrix material after the matrix material has set in order to form pores within the matrix and thereby reduce the overall value of the dielectric constant of the IMD layer 110. The porogen may be a material that is big enough to form the pores while also remaining small enough such that the size of the individual pores does not overly displace the matrix material. As such, the porogen may include an organic molecule such as alpha-terpinene (ATRP) (1-Isopropyl-4-Methyl-1,3-Cyclohexadiene) or cyclooctane (boat shape) or 1,2-bis(triethoxysilyl) ethane silicon.

After the precursor layer has been formed with the porogen dispersed within the matrix material, the porogen is removed from the matrix material to form the pores within the matrix material. In an embodiment the removal of the porogen is performed by an annealing process which can break down and vaporize the porogen material, thereby allowing the porogen material to diffuse and leave the matrix material, thereby leaving behind a structurally intact porous dielectric material as the IMD layer 110. For example, an anneal of in a range from about 200° C. and about 500° C., such as about 400° C., for in a range from about 10 seconds to about 600 seconds, such as about 200 seconds, may be utilized. Alternatively, other suitable processes may be used to remove the porogen, such as irradiating the porogen with ultraviolet (UV) radiation to decompose the porogen or utilizing microwaves to decompose the porogen.

Figure 8:
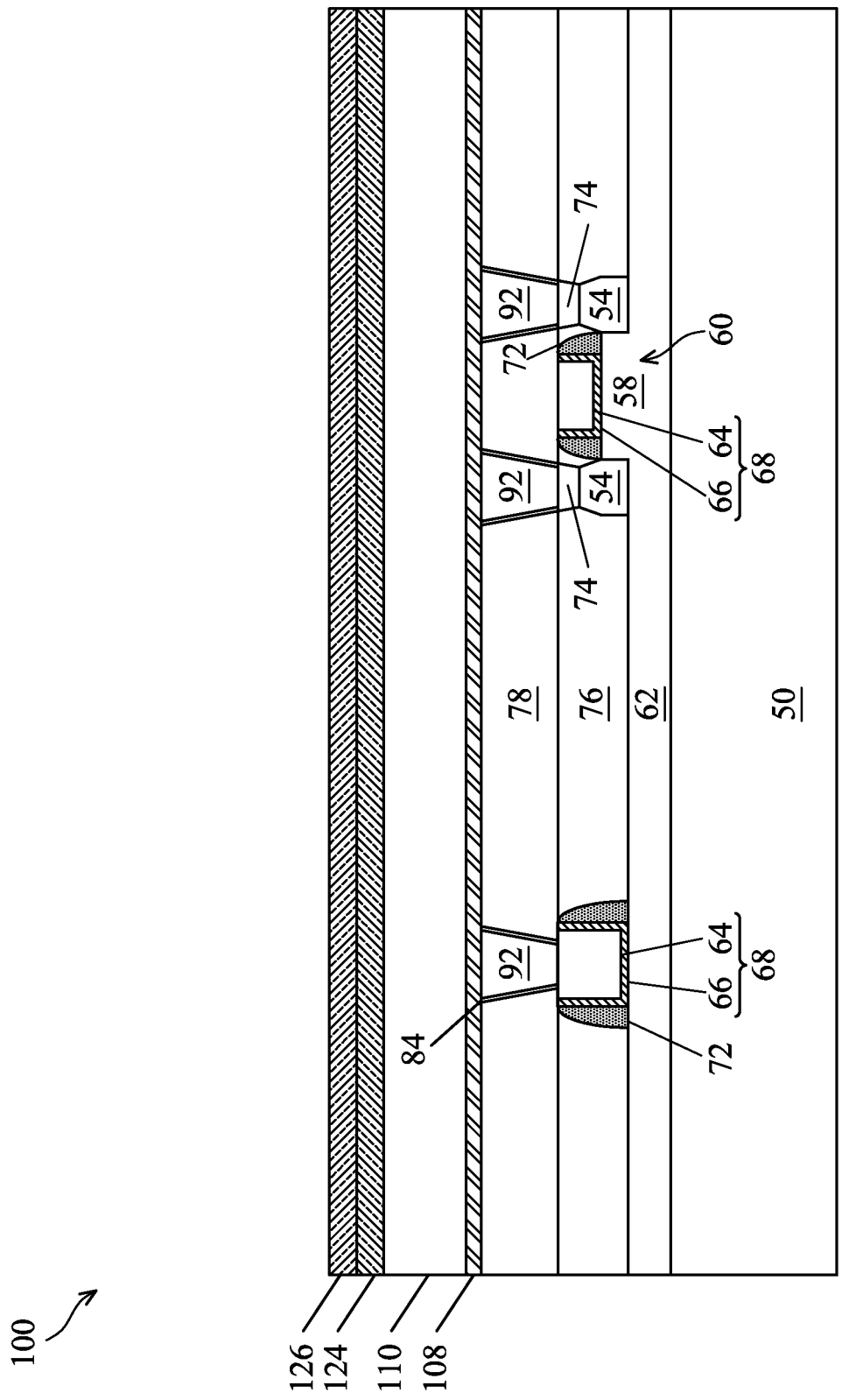

In FIG. 8, a film stack is formed over the IMD layer 110. In accordance with some embodiments, the film stack is used to form conductive lines that are electrically connected to the upper contact plugs 92. The film stack includes a buffer layer 124 and a mask layer 126. In some embodiments, the film stack includes more than one buffer layer and mask layer, which may be formed in alternating fashion.

The buffer layer 124 is formed over the IMD layer 110, and the mask layer 126 is formed over the buffer layer 124. The buffer layer 124 may be formed from a dielectric, such as silicon oxide, and may be formed by CVD, PVD, ALD, a spin-on-dielectric process, or the like. The mask layer 126 may be formed from a material that includes a metal, such as titanium nitride, titanium, tantalum nitride, tantalum, or the like, and may be formed by PVD, Radio Frequency PVD (RFPVD), ALD, or the like. In subsequent processing steps, a pattern is formed on the mask layer 126. The mask layer 126 is then used as an etching mask, where the pattern of the mask layer 126 is used to etch the IMD layer 110. The buffer layer 124 provides stress reduction between the IMD layer 110 and the mask layer 126.

Figure 9:
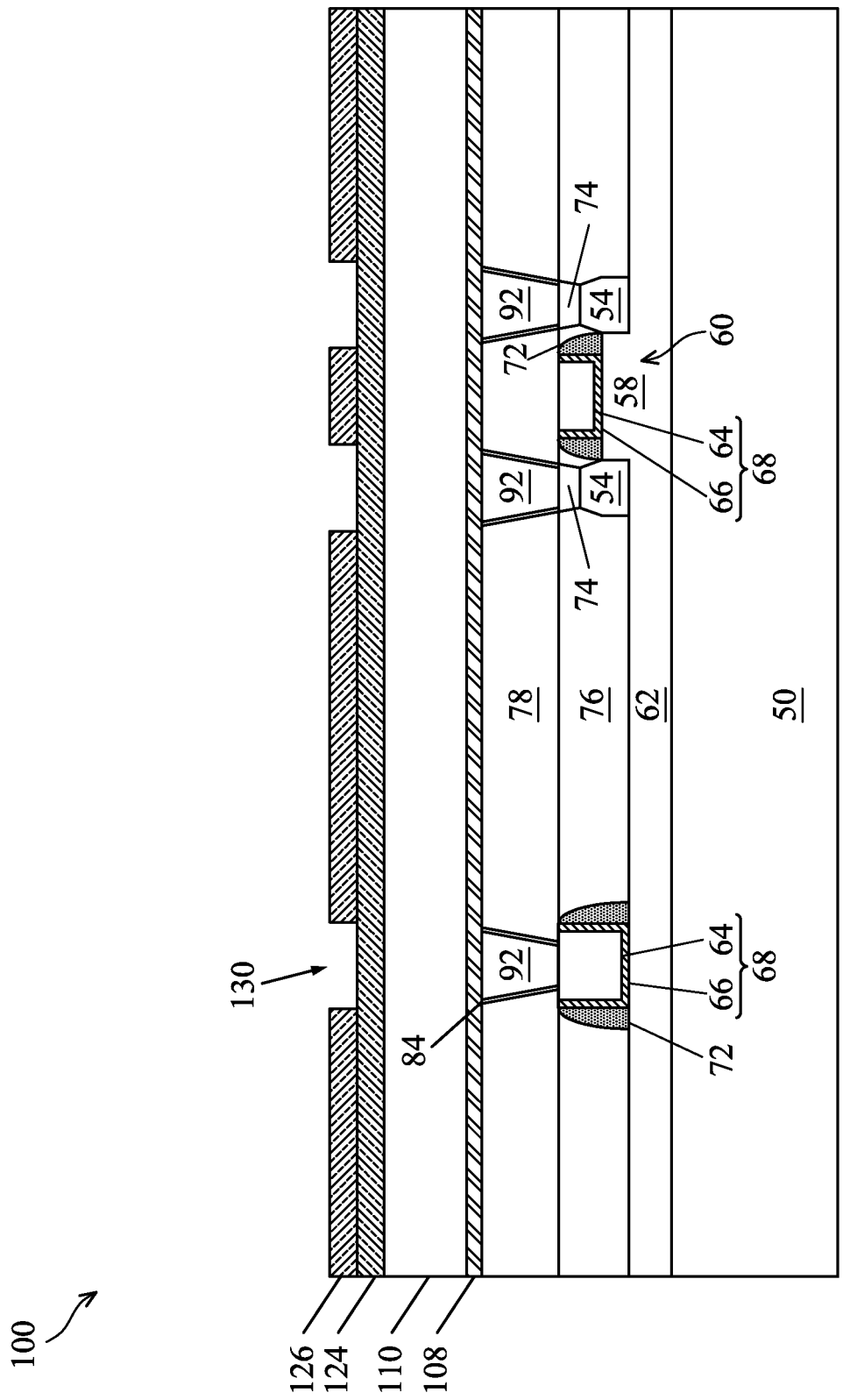

In FIG. 9, openings 130 are formed in the mask layer 126. Formation of the openings 130 may include performing a photolithography process to etch the mask layer 126 in order to form initial openings. The photolithography process may include forming a photoresist (not specifically illustrated) over the mask layer 126, patterning the photoresist with openings corresponding to the openings 130 extending the openings 130 through the mask layer 126, and then removing the photoresist.

Figure 10:
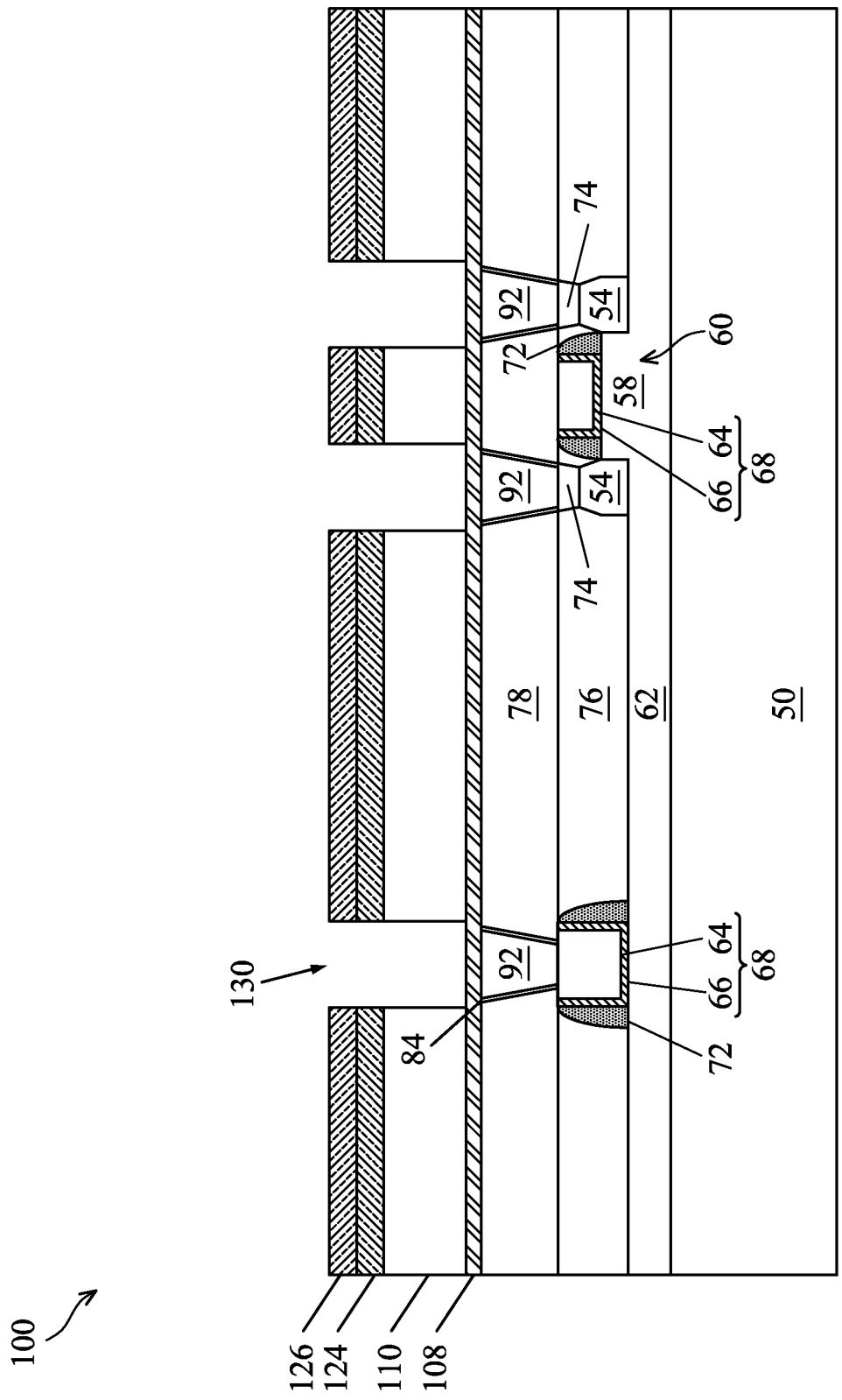

In FIG. 10, the openings 130 are extended through the buffer layer 124 and the IMD layer 110. The openings 130 may be extended by using acceptable etching techniques. In an embodiment, the openings 130 are formed by an anisotropic dry etch process. For example, the etching process may include a dry etch process using a reaction gas that selectively etches the IMD layer 110 without significantly etching the mask layer 126. The etching process is performed until the openings 130 expose the etch stop layer 108. For example, the etching process may include the formation of a reactive species from an etchant gas using a plasma. In some embodiments, the plasma may be a remote plasma. The etchant gas may include a fluorocarbon chemistry such as $C_4F_6/CF_4/C_5F$ and $NF_3/O_2/N_2/Ar/H_3/H_2$, the like, or a combination thereof. In some embodiments, the etchant uses fluorocarbon chemistry with $O_2$ or Ar as the carrier gas.

Figure 11:
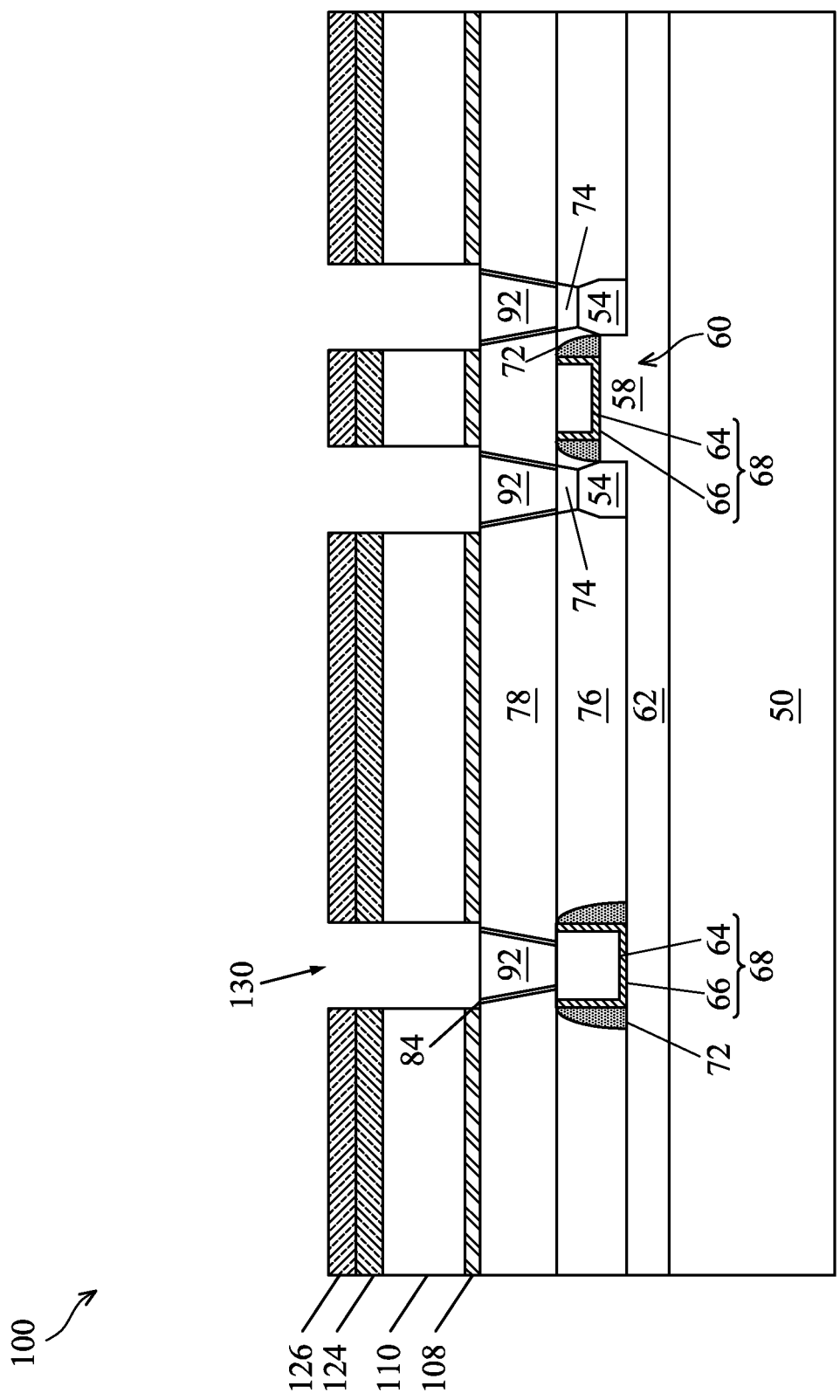

In FIG. 11, portions of the etch stop layer 108 in the openings 130 are removed to expose the underlying upper contact plugs 92. The etch stop layer 108 may be removed using an anisotropic wet or dry etch that is selective to the material of the etch stop layer 108. For example, the etch stop layer 108 may be remove using an anisotropic wet etch that uses etchant reactants such as I-1202. The etching process used to remove the etch stop layer 108 may be different from the etching processes used to form the openings 130 (e.g., different etchants and/or other etching process parameters may be used).

Figure 12:
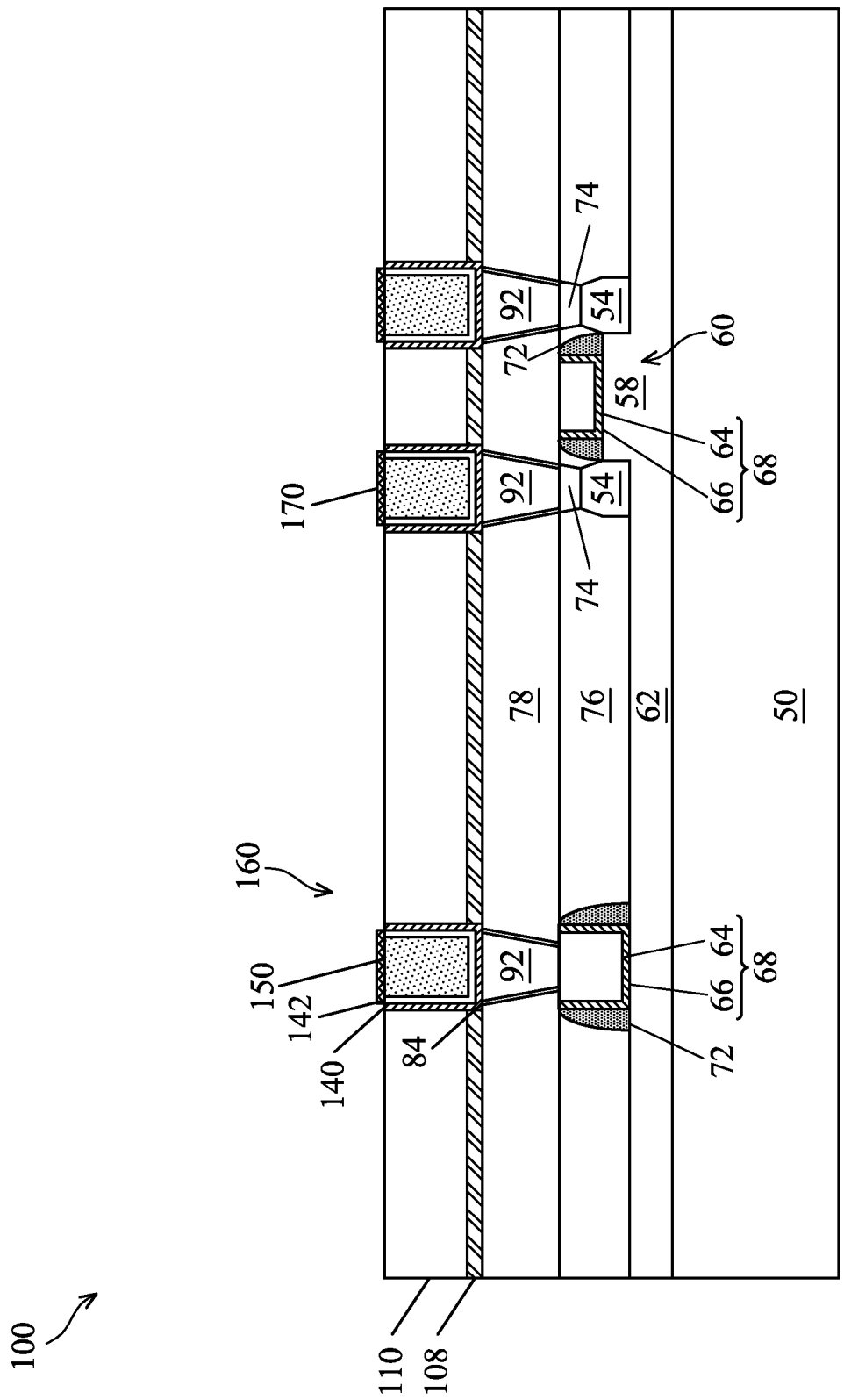

In FIG. 12, a barrier layer 140 is formed on the exposed surface of the wafer 100 and in the openings 130. In accordance with some embodiments, the formation of the barrier layer 140 may include PVD, ALD, or a combination thereof. In some exemplary deposition process, Ar is introduced into the respective deposition chamber (not shown), in which wafer 100 is placed, to sputter metal ions (such as titanium ($Ti^+$) or tantalum ($Ta^+$)) or atoms without charges (such as titanium (Ti) or tantalum (Ta)) from the respective target (not shown) used in the PVD. Nitrogen may be added into the process gases. The sputtered metal ions are deposited onto wafer 100, forming the barrier layer 140, which is conductive. In the deposition of the barrier layer 140, a DC power and/or a radio frequency (RF) power may be applied. After deposition, the barrier layer 140 includes portions directly over the IMD layer 110, portions on the sidewalls of the openings 130 (e.g., sidewalls of the mask layer 126, the buffer layer 124, the IMD layer 110, and the etch stop layer 108), and portions at the bottom of the openings 130.

Still referring to FIG. 12, a liner layer 142 is formed on the exposed surface of the wafer 100 and in the openings 130. The liner layer 142 may be formed from cobalt, tantalum, titanium, tantalum nitride, titanium nitride, ruthenium, or the like, and may be formed by a deposition process such as CVD, PVD, ALD, the like, or a combination thereof.

A conductive material 150 is deposited over the liner layer 142 and filled into the openings 130. Excess conductive material 150 may also be formed along top surfaces of the liner layer 142. The conductive material 150 may be a metallic material including a metal or a metal alloy such as copper, silver, gold, tungsten, cobalt, aluminum, or alloys thereof. In some embodiments, the formation of the conductive material 150 includes depositing a thin seed layer (not shown), which may include copper or a copper alloy, and filling the rest of the openings 130 using CVD, PVD, ALD, ECP, such as high voltage ECP, or electro-less plating.

In accordance with some embodiments, a deposition method, such as PVD, may be used to form the conductive material 150 in the openings 130. For example, a first deposition of copper may be performed at room temperature, which may be followed by a reflow process at about 150° C. to about 300° C. for about 1 minute to about 5 minutes. One or more depositions of copper and reflow processes may follow the first cycle. In total, there may be one to five, or more, alternating cycles of depositions and reflow processes.

Still referring to FIG. 12, a planarization process may be performed to remove excess of the conductive material 150, the liner layer 142, and the barrier layer 140, thereby forming conductive lines 160 in the openings 130. In addition, the planarization process may remove remaining portions of the mask layer 126 and the buffer layer 124, thereby exposing the IMD layer 110. The planarization process may be a grinding or a CMP, and may be performed such that the top surfaces of the conductive material 150, the liner layer 142, the barrier layer 140, and the IMD layer 110 are level or are substantially level. The conductive lines 160 include remaining portions of the conductive material 150 and the remaining portions of the liner layer 142 and the barrier layer 140 extending along the sidewalls and bottoms of the conductive material 150. The conductive lines 160 are, therefore, physically and electrically connected to the upper contact plugs 92.

A capping layer 170 may be deposited over the IMD layer 110, the barrier layer 140, the liner layer 142, and the conductive material 150 using CVD, PECVD, PVD, ALD, PEALD, ECP, electroless plating, and/or the like. The capping layer 170 may comprise cobalt, ruthenium, the like, or any combination thereof. The capping layer 170 may be considered part of the conductive lines 160. In accordance with some embodiments, the capping layer 170 is deposited using CVD. The deposition may use a cobalt precursor that includes a molecule that comprises cobalt attached to carbon, oxygen, hydrogen, or combinations thereof. After depositing the material for the capping layer 170, excess portions may be removed with any suitable method, such as using lithography. As such, a photoresist (not specifically illustrated) may be formed over the material of the capping layer 170 and patterned to expose portions of the material of the capping layer 170 that are not directly over the conductive lines 160 (e.g., the liner layer 142 and the conductive material 150). The exposed portions may then be removed by etching or any suitable method. In some embodiments, the capping layer 170 is selectively deposited over the conductive material 150. In addition, portions of the capping layer 170 may also be deposited over the liner layer 142 and, perhaps, the barrier layer 140. The capping layer 170 may be deposited using any of the techniques identified with respect to the barrier layer 140, the liner layer 142 or the conductive material 150. The capping layer 170 may have a thickness of between about 15 Å and about 50 Å, in accordance with some embodiments.

In accordance with some embodiments and not specifically illustrated, before depositing the capping layer 170, upper portions of the conductive lines 160 (e.g., the conductive material 150 and the liner layer 142) may be etched and recessed by between about 0 Å and about 50 Å. Next, the material of the capping layer may be deposited over the structure and into the recesses by one of the methods listed above, such as selective deposition by CVD.

Figure 13:
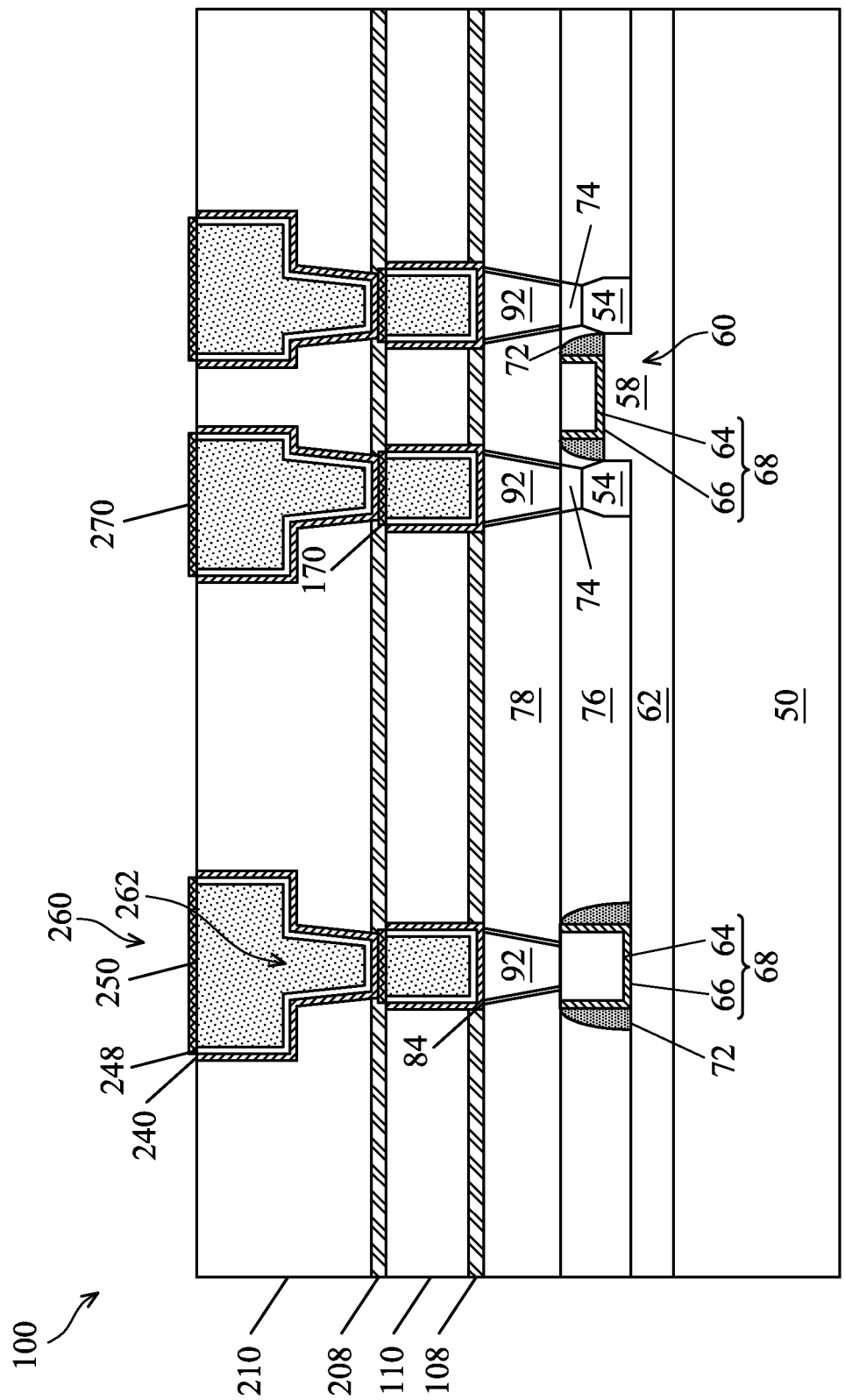

In FIG. 13, an etch stop layer 208 is formed over the IMD layer 110 and the conductive lines 160. The etch stop layer 208 may be formed of similar materials and by a similar process as described above in connection with the etch stop layer 108.

Still referring to FIG. 13, an IMD layer 210 is formed over the etch stop layer 208. The IMD layer 210 may be formed of similar materials and by a similar process as described above in connection with the IMD layer 110. The material of the etch stop layer 208 has a high etching selectivity with the IMD layer 210, and hence the etch stop layer 208 may be used to stop the etching of the IMD layer 210 in subsequent processing steps.

A film stack is formed over the IMD layer 210. In accordance with some embodiments, the film stack is used to form metallization lines and vias that are electrically connected to the conductive lines 160. The film stack (not specifically illustrated) includes a buffer layer and a mask layer. In some embodiments, the film stack includes more than one buffer layer and mask layer, which may be formed in alternating fashion. The buffer layer and the mask layer may be formed of similar materials and by similar processes as described above in connection with the buffer layer 124 and the mask layer 126.

Openings (not specifically illustrated) are then formed in the mask layer, and the openings are extended through the buffer layer, the IMD layer 210, and the etch stop layer 208. The openings may be formed and extended by the acceptable etching techniques and etchants described above in connection with openings 130. The openings expose the underlying conductive lines 160 (particularly, the capping layer 170, if used). The etch stop layer 208 may be removed using an anisotropic wet or dry etch that is selective to the material of the etch stop layer 108. For example, the etch stop layer 208 may be remove using an anisotropic wet etch that uses etchant reactants such as I-1202. The etching process used to remove the etch stop layer 208 may be different from the etching processes used to form the openings (e.g., different etchants and/or other etching process parameters may be used).

As illustrated, the openings may be patterned using a dual damascene process. As such, the upper portions of the openings house the metallization lines 260, and the lower portions of the openings house metallization vias 262 to electrically connect the metallization lines 260 with the conductive lines 160 below.

A barrier layer 240 and a liner layer 242 are formed in the openings. The barrier layer 240 may be formed of similar materials and by a similar process as described above in connection with the barrier layer 140. The liner layer 242 may be formed of similar materials and by a similar process as described above in connection with the liner layer 142.

Still referring to FIG. 13 conductive material 250 is filled into the openings and along top surfaces of the liner layer 242, and a planarization process is performed to remove excess of the conductive material 250, the liner layer 242, and the barrier layer 240 to form the metallization lines 260 and the metallization vias 262. The conductive material 250 may be formed of similar materials and by a similar process as described above in connection with the conductive material 150.

In accordance with some embodiments, a deposition method, such as PVD, may be used to form the conductive material 250 in the openings. For example, a first deposition of copper may be performed at room temperature, which may be followed by a reflow process at about 150° C. to about 300° C. for about 1 minute to about 10 minutes. One or more depositions of copper and reflow processes may follow the first cycle. In total, there may be one to five alternating cycles of depositions and reflow processes.

The planarization process removes excess of the conductive material 250, the liner layer 242, and the barrier layer 240, thereby forming the metallization lines 260 and the metallization vias 262. In addition, the planarization process may remove remaining portions of the mask layer and the buffer layer, thereby exposing the IMD layer 210. The planarization process may be a grinding or a CMP, and may be performed such that the top surfaces of the conductive material 250, the liner layer 242, the barrier layer 240, and the IMD layer 210 are level or are substantially level. The metallization lines 260 and the metallization vias 262 include remaining portions of the conductive material 250 and the remaining portions of the liner layer 242 and the barrier layer 240 extending along the sidewalls and bottoms of the conductive material 250. The metallization lines 260 are electrically connected to the conductive lines 160 by the metallization vias 262.

Furthermore, a capping layer 270 may be formed over the conductive material 250 and the liner layer 242 of the metallization lines 260. The capping layer 270 may be formed of similar materials (e.g., cobalt) and by a similar process as described above in connection with the capping layer 170. The capping layer 270 may be considered part of the metallization lines 260. The capping layer 270 may have a thickness of between about 15 Å and about 50 Å.

Following completion of the metallization lines 260 and the metallization vias 262, additional metallization lines (not specifically illustrated) may be formed over the metallization lines 260 using similar materials and similar processes as described above with either the conductive lines 160 or the metallization lines 260. Connectors (also not specifically illustrated) may then be formed over the additional metallization lines.

Figure 14:
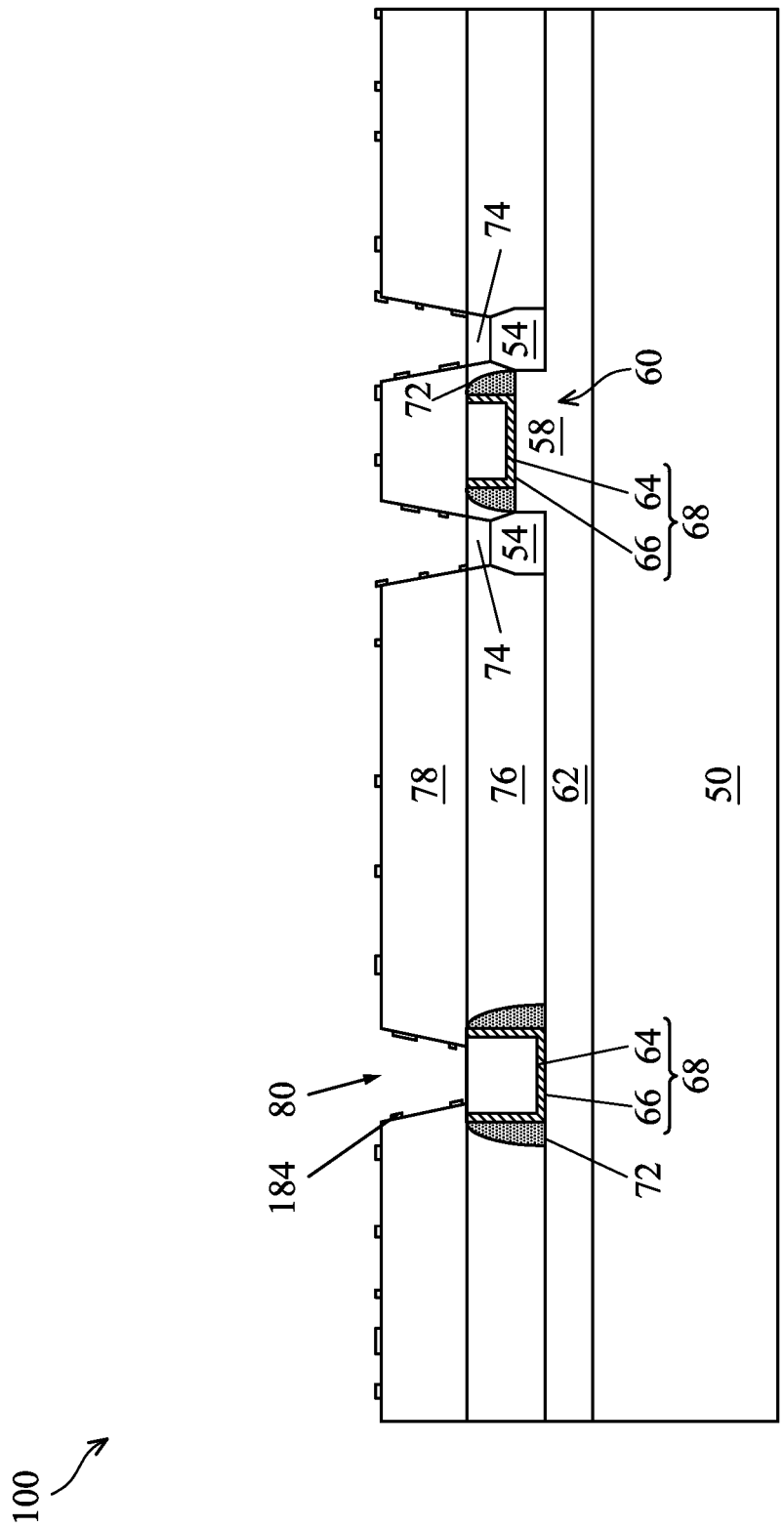

In FIG. 14, in accordance with some embodiments, the second ILD layer 78 (as formed above in connection with FIGS. 1-3) may have a relatively low concentration or density of hydroxyl groups along the exposed surface. As such, during formation of a self-aligned monolayer 184, the monolayer precursor will selectively react with or be attracted to the discrete or isolated hydroxyl groups such that the resulting self-aligned monolayer 184 forms in discrete portions or patches over the second ILD layer 78, as illustrated in FIG. 14. In embodiments in which formation of the self-aligned monolayer 184 is by deposition of a non-reactive organic molecule, the self-aligned monolayer 184 may form in discrete portions or patches near and over the discrete or isolated hydroxyl groups due to the organic molecules being attracted to those regions without forming chemical bonds. As a result of forming the self-aligned monolayer 84 comprising silylation of the second ILD layer 78 or comprising a hydrophobic molecule, the surface of the second ILD layer 78 may be converted from being hydrophilic to hydrophobic.

Figure 15:
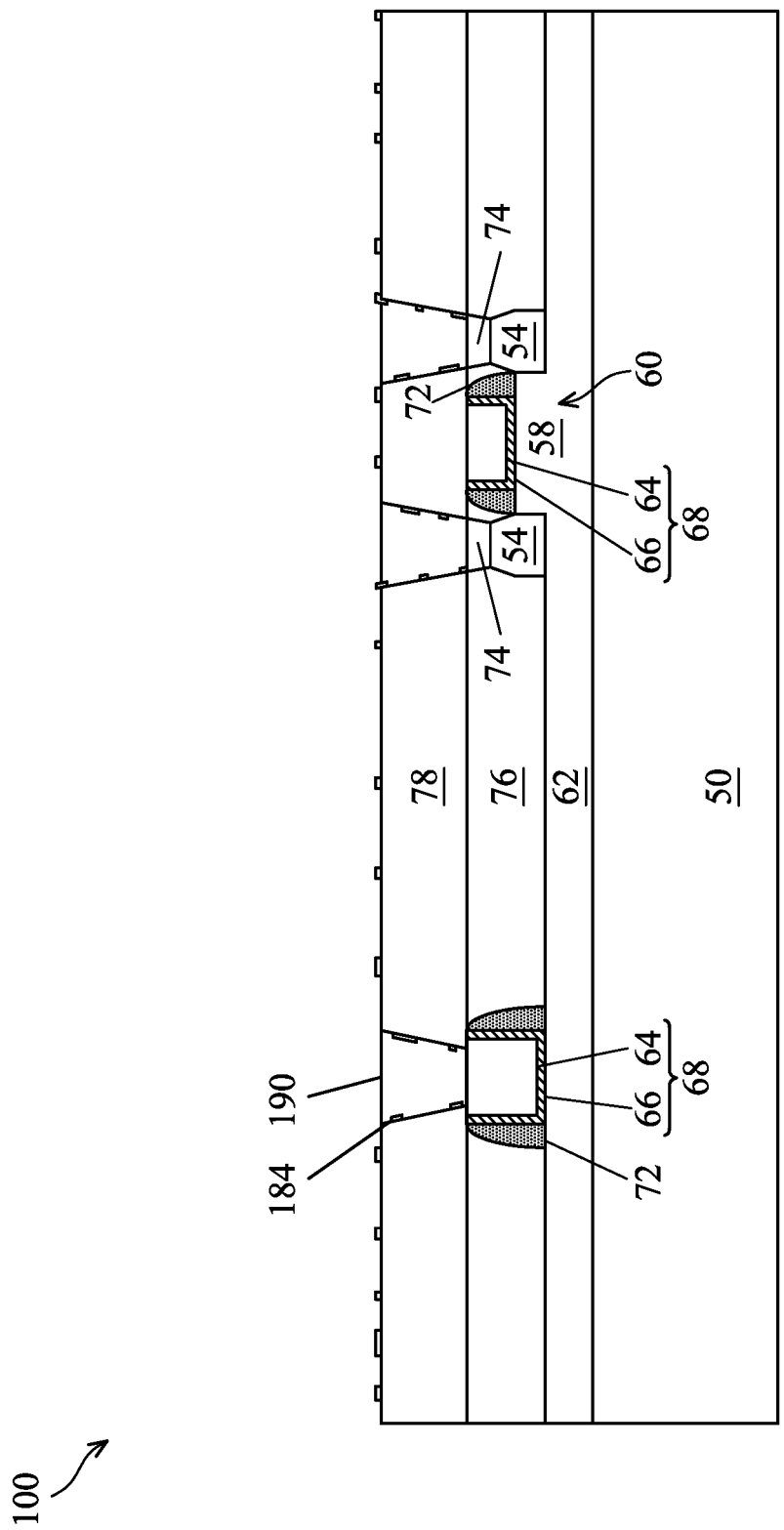

In FIG. 15, a conductive material 190 is filled into the openings 80. The conductive material 190 may be formed of a similar material and by similar processes and mechanisms as discussed above with respect to the conductive material 90. Despite a somewhat uneven topography (e.g., due to the discrete portions of the self-aligned monolayer 184), growth of the conductive material 190 will generally proceed as described above when the self-aligned monolayer 184 provides a more even topography. The same benefits related to not requiring a seed layer or a barrier layer apply as well.

Figure 16:
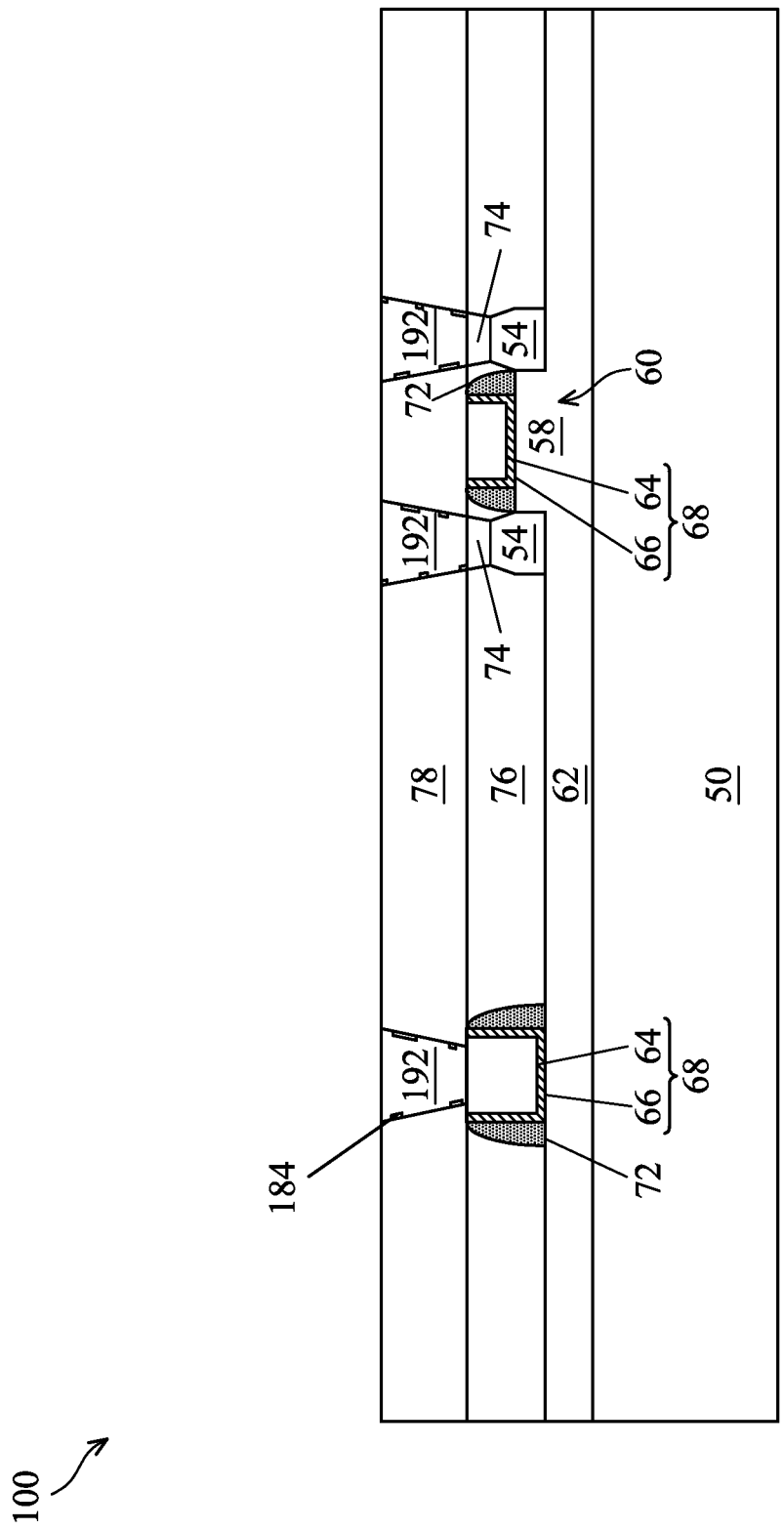

In FIG. 16, upper contact plugs 192 are formed by performing a planarization (e.g., CMP) on the conductive material 190, the self-aligned monolayer 184, and the second ILD layer 78. As a result, top surfaces of the upper contact plugs 192 and the second ILD layer 78 will be level. In addition, the self-aligned monolayer 184 will be removed from top surfaces of the second ILD layer 78 while still being directly interposed between the second ILD layer 78 and the upper contact plugs 192. The resulting upper contact plugs 192 will achieve similar benefits as described above with respect to FIGS. 5-6. Following formation of the upper contact plugs 192, the remainder of the process follows the same steps as described above in connection with FIGS. 7-13 and onward.

In the above embodiments, the same or similar materials and processes were described for forming the conductive lines 160 and the metallization lines 260 with the metallization vias 262. In addition, one or more steps of forming the metallization lines 260 with the metallization vias 262 may be performed using different materials and/or processes as compared with the corresponding step of forming the conductive lines 160.

FIGS. 17-18 illustrate cross-sectional views of intermediate stages in the formation of conductive features (e.g., plugs, contact pads, etc.), in accordance with some embodiments. The conductive features may be the same or similar to those discussed above or conductive features formed in other steps throughout the semiconductor manufacturing process, such as in cases in which a dielectric layer is patterned to form conductive features that will couple underlying elements to subsequently formed overlying elements or to subsequently attached semiconductor packages.

In FIG. 17, a dielectric layer 278 has been formed over a substrate 250. The substrate 250 may be a semiconductor substrate or represent any layer of semiconductor components that have previously been formed. The dielectric layer 278 may be one layer or a plurality of layers comprising materials such as silicon nitride, silicon oxide, silicon oxynitride, the like, or any combinations thereof. Within openings 280 in the dielectric layer 278, lower conductive features 274 may have been formed. In some embodiments, the lower conductive features 274 may have been formed over the substrate 250, and one or more of the layers of the dielectric layer 278 may have been formed around the lower conductive features 274.

As illustrated and discussed above in connection with other features, an exposed surface of the dielectric layer 278 may comprise hydroxyl (—OH) groups, which may lower the selectivity for a subsequent deposition of another conductive material into the openings 280. A cleaning process similar to that discussed above in connection with FIG. 3 may be performed on the dielectric layer 278 to increase the concentration of hydroxyl groups along the exposed surface of the dielectric layer 278.

In FIG. 18, a self-aligned monolayer (SAM) 284 is formed over the dielectric layer 278. As discussed above, the self-aligned monolayer 284 protects the dielectric layer 278 (or portions of the dielectric layer 278) from metal growth when depositing conductive material 290 by increasing the selectivity between growth of the conductive material 290 onto the lower conductive feature 274 versus onto the surface of the dielectric layer 278 and/or the self-aligned monolayer 284. Similarly as described above, the self-aligned monolayer 284 may be formed by reacting a monolayer precursor with the hydroxyl groups extending from the surface of the dielectric layer 278 or by flowing a non-reactive molecule to be attracted to and adsorb to the dielectric layer 278 (particularly, the hydroxyl groups of the dielectric layer 278).

After forming the self-aligned monolayer 284, the conductive material 290 may be selectively deposited over the lower conductive feature 274 with minimal conductive material 290 being deposited over the dielectric layer 278 or the self-aligned monolayer 284. In addition, as discussed above, a planarization step or other processing steps (not specifically illustrated) may be performed to form the conductive material 290 into an upper conductive feature 292.

Embodiments may achieve advantages. Forming the self-aligned monolayer 84/184/284 over the second ILD layer 78 (or the dielectric layer 278) improves the selectivity of depositing the conductive material 90/190 into the openings 80/280 and directly over metal, such as metal in the gate electrodes 64, lower contact plugs 74, and conductive features 274. For example, the self-aligned monolayer 84/184/284 may comprise a silylation of hydroxyl groups along an exposed surface of the second ILD layer 78. Alternatively, the self-aligned monolayer 84/184/284 may comprise a non-reactive chemical attracted to the hydroxyl groups or adsorbed at or near the hydroxyl groups. In either case, depositing the conductive material 90/190 over the second ILD layer 78 (or the dielectric layer 278) is reduced or prevented due to the lack of exposed hydroxyl groups attracting the metal precursor intended to form the conductive material 90/190.

In addition, the self-aligned monolayer 84/184/284 interposed between the second ILD layer 78 and the conductive material 90/190/290 (and ultimately the upper contact plugs 92/192) is thinner than using a barrier layer (e.g., TiN or TaN) in the upper contact plugs or upper conductive features 92/192/292. Consequently, the upper contact plugs or upper conductive features 92/192/292 have an improved performance and reliability because the conductive material 90/190/290 comprises a larger portion (substantially at or close to 100%) of the region within the openings 80/280. Whether the self-aligned monolayer 84/184/284 comprises a silylation of the hydroxyl groups or comprises a non-reactive chemical attracted to or adsorbed to (or near) the hydroxyl groups, the formation of the self-aligned monolayer 84/184/284 may be more efficient, less expensive, and/or more effective than the alternative of forming a conductive barrier layer. In addition, the conductive material 90/190/390 may be deposited with improved efficiency and result in a more reliable and better performing conductive feature 92/192/292.

In an embodiment, a method of forming a semiconductor device includes: forming a semiconductor feature over a substrate, the semiconductor feature includes a conductive region; forming a dielectric layer over the semiconductor feature; patterning the dielectric layer to form a contact opening exposing a top surface of the conductive region; forming a monolayer over the dielectric layer, the top surface of the conductive region remaining exposed; and depositing a conductive material in the contact opening. In an embodiment, before forming the monolayer, the dielectric layer includes an exposed surface includes hydroxyl groups. In an embodiment, the method further includes, before forming the monolayer, performing a chemical treatment on the dielectric layer. In an embodiment, performing the chemical treatment increases a concentration of hydroxyl groups on a top surface of the dielectric layer. In an embodiment, after forming the monolayer, the top surface of the conductive region remains free of the monolayer. In an embodiment, the monolayer is chemically bonded to the dielectric layer. In an embodiment, the method further includes before forming the monolayer, a top surface of the dielectric layer having a first contact angle with water; and after forming the monolayer, a top combined surface of the dielectric layer and the monolayer having a second contact angle with water, the second contact angle being greater than the first contact angle. In an embodiment, after depositing the conductive material, a top surface of the monolayer remains free of the conductive material.

In another embodiment, a method of forming a semiconductor device includes: forming a first dielectric layer over a substrate; forming a first opening in the first dielectric layer to expose the substrate; forming a first conductive feature in the first opening, the first conductive feature includes a metal; forming a second dielectric layer over the first dielectric layer and the first conductive feature, wherein upon forming the second dielectric layer, the second dielectric layer has a first concentration of exposed hydroxyl groups; forming a second opening in the second dielectric layer to expose the first conductive feature; flowing a monolayer precursor over the second dielectric layer to form a monolayer over the second dielectric layer, wherein upon forming the monolayer, the second dielectric layer has a second concentration of exposed hydroxyl groups, the second concentration being less than the first concentration; and flowing a metal precursor over the second dielectric layer to deposit a metal feature into the second opening and over the first conductive feature. In an embodiment, the method further includes, before flowing the monolayer precursor, performing a chemical treatment, after performing the chemical treatment the second dielectric layer having a third concentration of exposed hydroxyl groups, the third concentration being greater than the first concentration. In an embodiment, the second dielectric layer includes silicon oxide. In an embodiment, the metal precursor has a first selectivity for the metal as compared to the second dielectric layer before the flowing the monolayer precursor, wherein the metal precursor has a second selectivity for the metal as compared to the second dielectric layer after the flowing the monolayer precursor, the second selectivity being greater than the first selectivity. In an embodiment, the metal feature includes tungsten. In an embodiment, the monolayer precursor reacts with exposed hydroxyl groups. In an embodiment, the monolayer precursor is attracted to exposed hydroxyl groups without bonding. In an embodiment, the monolayer precursor is an organic molecule.

In yet another embodiment, a semiconductor device includes: a first conductive feature embedded in a substrate; a first dielectric layer disposed over the first conductive feature; a second conductive feature extending through the first dielectric layer; a second dielectric layer disposed over the first dielectric layer; a self-aligned monolayer disposed over the second dielectric layer; and a third conductive feature extending through the second dielectric layer, a portion of the self-aligned monolayer being interposed between the second dielectric layer and the third conductive feature. In an embodiment, the portion of the self-aligned monolayer is continuous for a majority of a distance from a top surface of the second dielectric layer to a bottom surface of the second dielectric layer. In an embodiment, the self-aligned monolayer is chemically bonded to the second dielectric layer. In an embodiment, the self-aligned monolayer includes a different molecule from material of the second dielectric layer, material of the second conductive feature, and material of the third conductive feature.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, comprising:
    forming a semiconductor feature over a substrate, the semiconductor feature comprising a conductive region;
    forming a dielectric layer over the semiconductor feature;
    patterning the dielectric layer to form a contact opening exposing a top surface of the conductive region;
    forming a monolayer over the dielectric layer comprising flowing a non-reactive monolayer precursor over surfaces of the dielectric layer, the top surface of the conductive region remaining exposed, the non-reactive monolayer precursor being non-reactive with the surfaces of the dielectric layer; and
    depositing a conductive material in the contact opening.

2. The method of claim 1, wherein before forming the monolayer, the dielectric layer comprises an exposed surface comprising hydroxyl groups.

3. The method of claim 1 further comprising, before forming the monolayer, performing a chemical treatment on the dielectric layer.

4. The method of claim 3, wherein performing the chemical treatment increases a concentration of hydroxyl groups on a top surface of the dielectric layer.

5. The method of claim 1, wherein after forming the monolayer, the top surface of the conductive region remains free of the monolayer.

6. The method of claim 1 further comprising:
    before forming the monolayer, a top surface of the dielectric layer having a first contact angle with water; and
    after forming the monolayer, a top combined surface of the dielectric layer and the monolayer having a second contact angle with water, the second contact angle being greater than the first contact angle.

7. The method of claim 1, wherein after depositing the conductive material, a top surface of the monolayer remains free of the conductive material.

8. The method of claim 1, further comprising forming a conductive feature over and physically contacting the conductive material, the conductive material being different from each material of the conductive feature.

9. A method of forming a semiconductor device, comprising:
    forming a first dielectric layer over a substrate;
    forming a first opening in the first dielectric layer to expose the substrate;
    forming a first conductive feature in the first opening, the first conductive feature comprising a metal;
    forming a second dielectric layer over the first dielectric layer and the first conductive feature, wherein upon forming the second dielectric layer, the second dielectric layer has a first concentration of exposed hydroxyl groups;
    forming a second opening in the second dielectric layer to expose the first conductive feature;
    flowing a monolayer precursor over the second dielectric layer to form a monolayer over the second dielectric layer, wherein upon forming the monolayer, the second dielectric layer has a second concentration of exposed hydroxyl groups, the second concentration being less than the first concentration, the monolayer precursor being non-reactive with surfaces of the second dielectric layer; and
    flowing a metal precursor over the second dielectric layer to deposit a metal feature into the second opening and over the first conductive feature.

10. The method of claim 9 further comprising, before flowing the monolayer precursor, performing a chemical treatment, after performing the chemical treatment the second dielectric layer having a third concentration of exposed hydroxyl groups, the third concentration being greater than the first concentration.

11. The method of claim 9, wherein the second dielectric layer comprises silicon oxide.

12. The method of claim 9, wherein the metal precursor has a first selectivity for the metal as compared to the second dielectric layer before the flowing the monolayer precursor, wherein the metal precursor has a second selectivity for the metal as compared to the second dielectric layer after the flowing the monolayer precursor, the second selectivity being greater than the first selectivity.

13. The method of claim 9, wherein the metal feature comprises tungsten.

14. The method of claim 9, wherein the monolayer precursor is attracted to exposed hydroxyl groups without chemical bonding.

15. The method of claim 14, wherein the monolayer precursor is an organic molecule.

16. The method of claim 9, wherein molecules of the monolayer precursor are free of oxygen atoms.

17. A method of forming a semiconductor device, the method comprising:
    forming a first dielectric layer over a second dielectric layer, a conductive feature being embedded in the second dielectric layer, wherein upon forming the first dielectric layer, the first dielectric layer has a first concentration of exposed hydroxyl groups;
    patterning an opening in the first dielectric layer to expose the conductive feature;
    forming a hydrophobic layer over the first dielectric layer, the hydrophobic layer comprising a first portion along a top surface of the first dielectric layer and a second portion along sidewalls of the opening, the hydrophobic layer comprising a monolayer of hydrophobic molecules, the hydrophobic molecules remaining unreacted with the first dielectric layer;
    selectively depositing a conductive material in the opening and over the conductive feature;
    removing the first portion of the hydrophobic layer; and
    forming metallization layers of an interconnect structure over and electrically connected to the conductive material.

18. The method of claim 17, further comprising, before forming the hydrophobic layer, performing a chemical treatment on the first dielectric layer, wherein upon performing the chemical treatment, the first dielectric layer has a second concentration of exposed hydroxyl groups, wherein the second concentration is greater than the first concentration.

19. The method of claim 17, wherein the hydrophobic molecules are attracted to exposed hydroxyl groups of the first dielectric layer.

20. The method of claim 17, wherein the hydrophobic molecules comprise at least one of a benzene ring and a cyclohexane.

* * * * *